US011948902B2

(12) United States Patent
Hou et al.

(10) Patent No.: US 11,948,902 B2
(45) Date of Patent: Apr. 2, 2024

(54) BONDED ASSEMBLY INCLUDING AN AIRGAP CONTAINING BONDING-LEVEL DIELECTRIC LAYER AND METHODS OF FORMING THE SAME

(71) Applicant: SANDISK TECHNOLOGIES LLC, Addison, TX (US)

(72) Inventors: Lin Hou, Leuven (BE); Peter Rabkin, Cupertino, CA (US); Adarsh Rajashekhar, Santa Clara, CA (US); Raghuveer S. Makala, Campbell, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 273 days.

(21) Appl. No.: 17/370,317

(22) Filed: Jul. 8, 2021

(65) Prior Publication Data
US 2023/0008286 A1    Jan. 12, 2023

(51) Int. Cl.
*H01L 23/00* (2006.01)

(52) U.S. Cl.
CPC .............. *H01L 24/08* (2013.01); *H01L 24/03* (2013.01); *H01L 2224/0225* (2013.01); *H01L 2224/02255* (2013.01); *H01L 2224/0226* (2013.01); *H01L 2224/03452* (2013.01); *H01L 2224/03614* (2013.01); *H01L 2224/08146* (2013.01); *H01L 2924/1431* (2013.01); *H01L 2924/1438* (2013.01)

(58) Field of Classification Search
CPC ... H01L 2924/1431; H01L 2224/08146; H01L 2224/03614; H01L 2224/03452; H01L 24/03–08
See application file for complete search history.

(56) References Cited

U.S. PATENT DOCUMENTS

| 9,515,085 B2 | 12/2016 | Rabkin et al. |
| 10,115,459 B1 | 10/2018 | Yamada et al. |
| 10,283,493 B1 | 5/2019 | Nishida |
| 10,510,738 B2 | 12/2019 | Kim et al. |

(Continued)

OTHER PUBLICATIONS

Banerjee, G. et al., "Chemical Mechanical Planarization: Historical Review and Future Direction," ECS Transactions, vol. 13, No. 4, pp. 1-19 (2008), https://doi.org/10.1149/1.2912973.

(Continued)

*Primary Examiner* — Hoa B Trinh
(74) *Attorney, Agent, or Firm* — THE MARBURY LAW GROUP PLLC

(57) ABSTRACT

A bonded assembly includes a first semiconductor die containing a first substrate, first semiconductor devices, and first bonding pads laterally surrounded by a first pad-level dielectric layer. The first pad-level dielectric layer includes at least one first encapsulated airgap located between neighboring pairs of first bonding pads and encapsulated by a first dielectric fill material of the first pad-level dielectric layer. The bonded assembly includes a second semiconductor die containing a second substrate, second semiconductor devices, and second bonding pads laterally surrounded by a second pad-level dielectric layer. Each of the second bonding pads is bonded to a respective one of the first bonding pads.

20 Claims, 32 Drawing Sheets

(56) References Cited

U.S. PATENT DOCUMENTS

| | | | |
|---|---|---|---|
| 10,910,272 B1 | 2/2021 | Zhou et al. | |
| 2015/0364434 A1* | 12/2015 | Chen | H01L 24/03 257/773 |
| 2019/0221557 A1 | 7/2019 | Kim et al. | |
| 2021/0028135 A1 | 1/2021 | Said et al. | |
| 2021/0028149 A1 | 1/2021 | Makala et al. | |
| 2021/0202382 A1 | 7/2021 | Okina | |
| 2021/0343668 A1* | 11/2021 | Huang | H01L 24/03 |

OTHER PUBLICATIONS

He, W. et al., "Cu Barrier Seed Innovation for EM Improvement," ECS Transactions, vol. 60, No. 1, pp. 471-476 (2014), https://doi.org/10.1149/06001.0471ecst.

Messemaeker, J. et al., "Electromigration Behavior of Cu/SiCN to Cu/SiCN Hybrid Bonds for 3D Integrated Circuits," Extended Abstracts of the 2018 International Conference on Solid State Devices and Materials, Tokyo, pp. 449-450, (2018), https://confit.atlas.jp/guide/event-img/ssdm2018/G-1-04/public/pdf_archive?type=in.

Seo, J., "A review on chemical and mechanical phenomena at the wafer interface during chemical mechanical planarization," *Journal of Materials Research*, vol. 36, pp. 235-257 (2021), https://doi.org/10.1557/s43578-020-00060-x.

U.S. Appl. No. 16/774,446, filed Jan. 28, 2020, SanDisk Technologies LLC.

U.S. Appl. No. 16/851,839, filed Apr. 17, 2020, SanDisk Technologies LLC.

U.S. Appl. No. 16/851,908, filed Apr. 17, 2020, SanDisk Technologies LLC.

U.S. Appl. No. 17/208,019, filed Mar. 22, 2021, SanDisk Technologies LLC.

U.S. Appl. No. 17/357,040, filed Jun. 24, 2021, SanDisk Technologies LLC.

U.S. Appl. No. 17/357,120, filed Jun. 24, 2021, SanDisk Technologies LLC.

Notification of Transmittal of International Search Report and Written Opinion of the International Searching Authority for International Patent Application No. PCT/US2022/027238, dated Jul. 20, 2022, 10 pages.

\* cited by examiner

BONDED ASSEMBLY INCLUDING AN AIRGAP CONTAINING BONDING-LEVEL DIELECTRIC LAYER AND METHODS OF FORMING THE SAME

FIELD

The present disclosure relates generally to the field of semiconductor devices, and particularly to a bonded assembly of semiconductor devices including an airgap containing bonding-level dielectric layer and methods for forming the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a bonded assembly is provided, which comprises: a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises at least one first encapsulated airgap located between neighboring pairs of first bonding pads and encapsulated by a first dielectric fill material of the first pad-level dielectric layer; and a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads.

According to another aspect of the present disclosure, a method of forming a bonded assembly is provided, which comprises: providing a first semiconductor die comprising a first substrate, first semiconductor devices, and first dielectric material layers embedding first metal interconnect structures; forming a first metal layer over the first dielectric material layers; forming first bonding pads by patterning the first metal layer into first metal plates that are electrically connected to a respective node of the first semiconductor devices through the first metal interconnect structures; forming a first dielectric fill material layer containing at least one first encapsulated airgap embedded within a first dielectric fill material that is deposited between, and over, the first bonding pads, wherein each of the at least one first encapsulated airgap is formed between neighboring pairs of the first bonding pads; forming first openings through the first dielectric fill material layer, whereby top surfaces of the first bonding pads are physically exposed; providing a second semiconductor die comprising a second substrate, second semiconductor devices, and second bonding pads that are electrically connected to a respective node of the second semiconductor devices and laterally surrounded by a second pad-level dielectric layer; and bonding the first bonding pads to the second bonding pads.

According to yet another aspect of the present disclosure, a method of forming a bonded assembly is provided, which comprises: providing a first semiconductor die comprising a first substrate, first semiconductor devices, and first dielectric material layers embedding first metal interconnect structures; forming at least one first dielectric matrix layer and a first dielectric capping layer over the first dielectric material layers; forming first pad cavities through the first dielectric capping layer and the at least one first dielectric matrix layer; forming lateral recesses around the first pad cavities by laterally recessing the at least one first dielectric matrix layer; forming first encapsulated airgaps encapsulated by portions of a first dielectric fill material in the lateral recesses; forming first bonding pads in the first pad cavities; providing a second semiconductor die comprising a second substrate, second semiconductor devices, and second bonding pads that are electrically connected to a respective node of the second semiconductor devices and laterally surrounded by a second pad-level dielectric layer; and bonding the first bonding pads to the second bonding pads.

DETAILED DESCRIPTION

Figure 1:
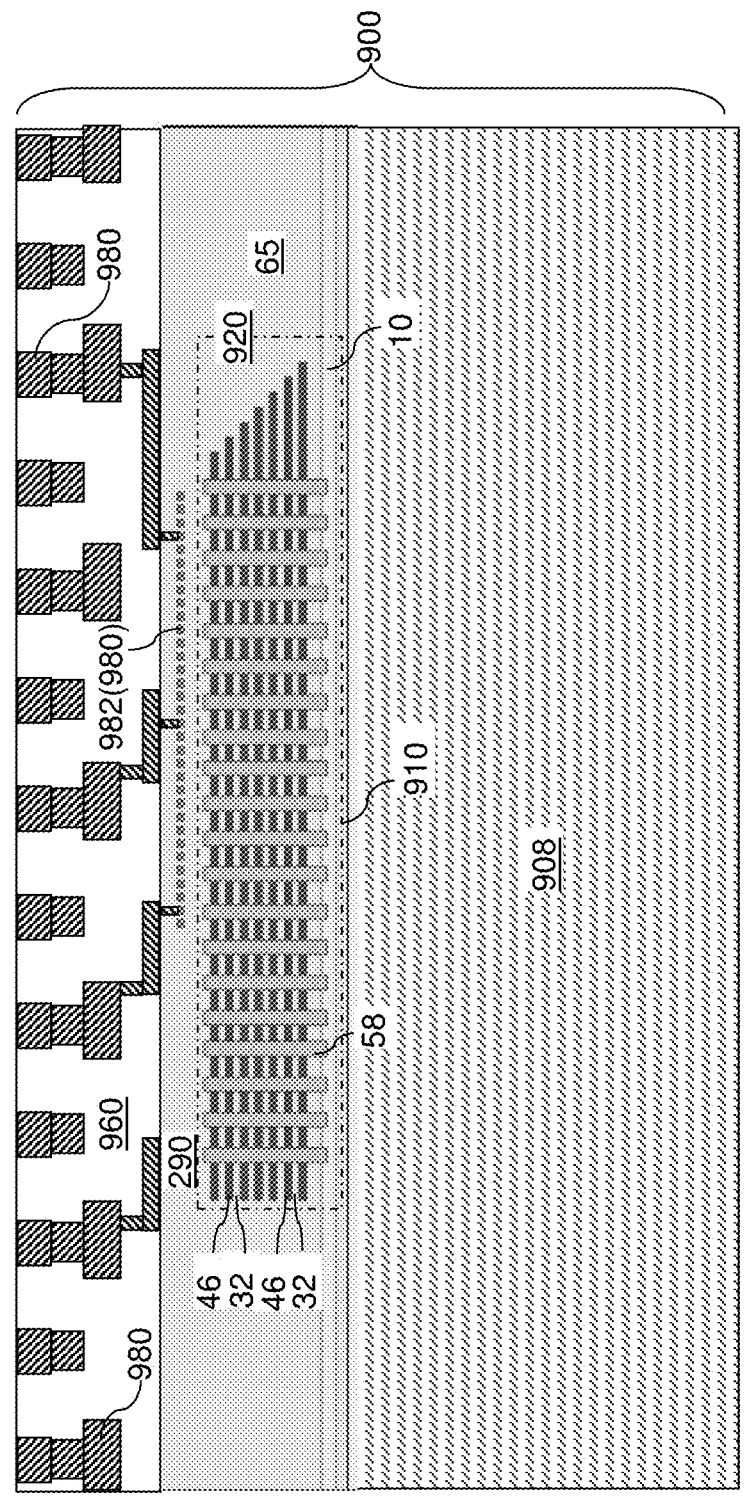
FIG. 1 is a schematic vertical cross-sectional view of a first semiconductor die for forming a first exemplary bonded assembly after formation of first dielectric material layers embedding first metal interconnect structures according to a first embodiment of the present disclosure.

Embodiments of the present disclosure can be employed to provide a bonded assembly of semiconductor devices including an airgap containing bonding-level dielectric layer and methods for forming the same, the various aspects of which are now described in detail. According to an aspect of the present disclosure, a bonded assembly of a memory die and a logic die can be employed to provide a high performance three-dimensional memory device with improved memory array density and easier interconnection between the memory array located in the memory die and the driver circuit located in the logic die.

One of the challenges in providing reliable metal-to-metal bonding and optional dielectric-to-dielectric bonding in a bonded assembly is avoiding interfacial defects in the bonding pads. For example, chemical mechanical polishing (CMP) process can generate voids at interfaces between metal bonding pads and metallic liners, which can adversely impact resistance of the bonded pairs of metal pads to electromigration. Further, as the density of metal pads increases and the pad-to-pad pitch of an array of bonding pads shrinks, capacitive coupling between neighboring pairs of metal pads can induce signal delay that is proportional to the product of the resistance of a mating pair of bonding pads and the capacitance of pad-level dielectric material layers surrounding the mating pair of bonding pads. Embodiments of the present disclosure provide a bonded assembly that eliminates or reduces polishing induced interfacial defects and reduces the RC delay by employing airgap containing dielectric fill material at the levels of the metal bonding pads.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to an embodiment of the present disclosure is illustrated. The first semiconductor die 900 includes a first substrate 908, first semiconductor devices 920 overlying the first substrate 908, first dielectric material layers (290, 960) overlying the first semiconductor devices, and first metal interconnect structures 980 embedded in the first dielectric material layers (290, 960). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960) may include first contact-level dielectric layers 290 embedding contact via structures and bit lines 982, and first interconnect-level dielectric layers 960 that embed a subset of the first metal interconnect structures 980 located above the first contact-level dielectric layers 290. The bit lines 982 are a subset of the first metal interconnect structures 980 and may electrically contact drain regions located above the semiconductor channel at the top of the memory opening fill structures 58. Interconnect metal lines and interconnect metal via structures, which are subsets of the first metal interconnect structures 980) may be embedded in the first interconnect-level dielectric layers 960. The first metal interconnect structures 980 can be located within the first interconnect-level dielectric layers 960. In an illustrative example, the first metal interconnect structures 980 may include a first memory-side metal level M0 including memory-side first-level metal lines, and a second memory-side metal level M1 including memory-side second-level metal lines.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. A topmost layer of the first interconnect-level dielectric layers 960 may be a dielectric diffusion barrier layer (not expressly shown), which may be a silicon nitride layer having a thickness in a range from 10 nm to 300 nm.

Figure 2:
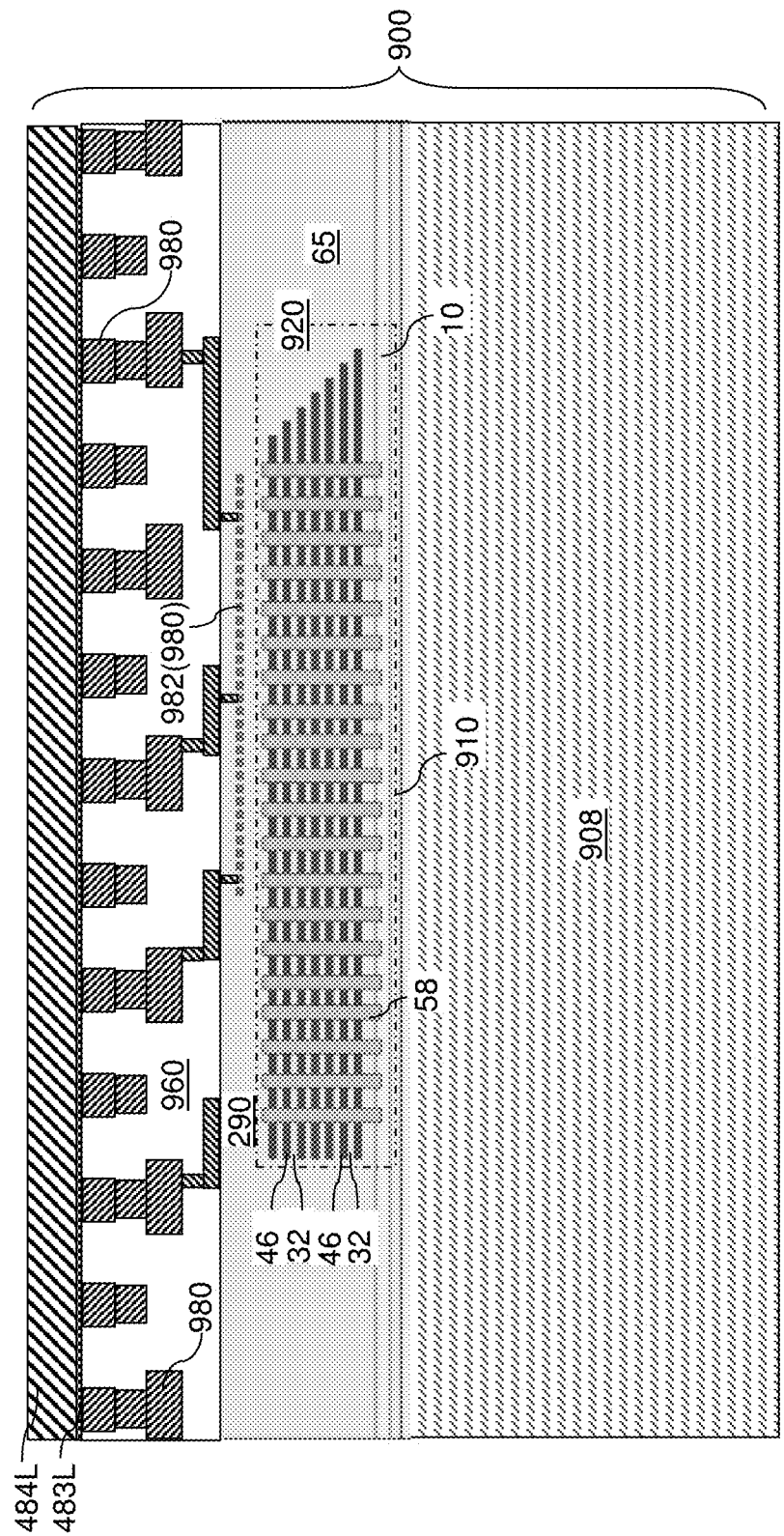
FIG. 2 is a schematic vertical cross-sectional view of the first semiconductor die after formation of a first metallic adhesion liner layer and a first metal layer according to the first embodiment of the present disclosure.

Referring to FIG. 2, an optional first metallic adhesion liner layer 483L and a first metal layer 484L can be formed over the first dielectric material layers (290, 960). The optional first metallic adhesion liner layer 483L includes a metallic material that can enhance adhesion of the first metal layer 484L to the physically exposed surfaces of the first metal interconnect structures 980 and the first dielectric material layers 960. For example, the first metallic adhesion liner layer 483L may include titanium nitride, tantalum nitride, tungsten nitride, or a combination thereof. The thickness of the first metallic adhesion liner layer 483L may be in a range from 1 nm to 10 nm, such as from 2 nm to 5 nm, although lesser and greater thicknesses may also be employed. The first metal layer 484L includes a metal that can be employed as a main material for first bonding pads. The first metal layer 484L may include copper or a copper-based alloy material. The thickness of the first metal layer 484L may be in a range from 30 nm to 1,000 nm, such as from 50 nm to 500 nm, although lesser and greater thicknesses may also be employed.

Figure 3:
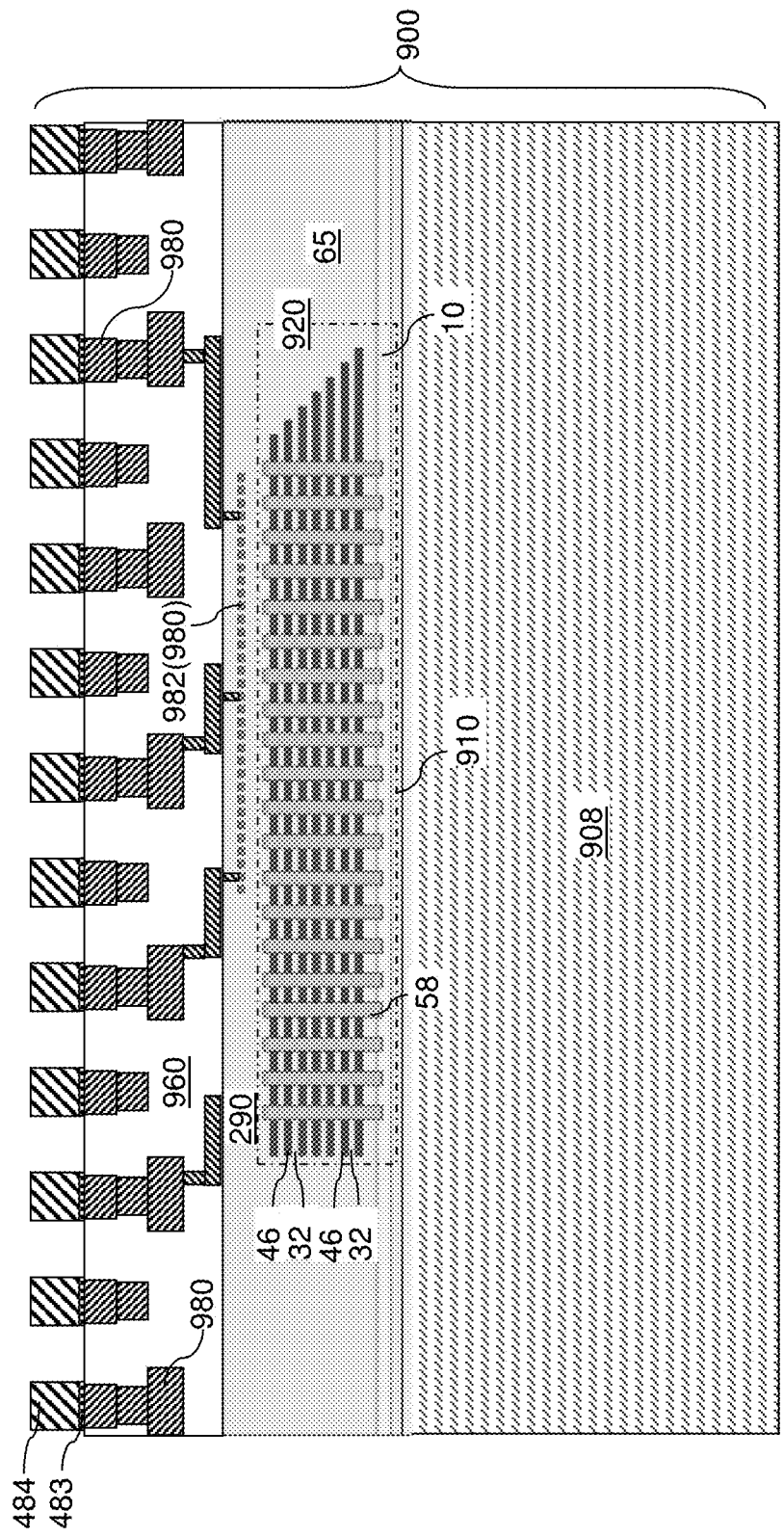
FIG. 3 is a schematic vertical cross-sectional view of the first semiconductor die after formation of stacks of a first metallic adhesion liner and a first metal plate according to the first embodiment of the present disclosure.

Referring to FIG. 3, the first metal layer 484L and the optional first metallic adhesion liner layer 483L can be patterned into a two-dimensional array of stacks of a first metallic adhesion liner 483 and a first metal plate 484. For example, a photoresist layer (not shown) can be applied over the first metal layer 484L, and can be lithographically patterned into a two-dimensional array of discrete photoresist material portions. An anisotropic etch process can be performed to transfer the pattern of the discrete photoresist material portions through the first metal layer 484L and the optional first metallic adhesion liner layer 483L. The first metal layer 484L is patterned into a two-dimensional array of first metal plates 484, and the first metallic adhesion liner layer 483L may be patterned into a two-dimensional array of first metallic adhesion liners 483.

At least a subset of the stacks of a first metallic adhesion liner 483 and a first metal plate 484 may be electrically connected to a respective node of the first semiconductor devices 920 through the first metal interconnect structures 980. In one embodiment, a predominant subset (i.e., more than 50%) of the stacks of a first metallic adhesion liner 483 may be electrically connected to a respective node of the first semiconductor devices 920 through the first metal interconnect structures 980. If the first metallic adhesion liners 483 are present, each of the first metallic adhesion liners 483 may contact a proximal planar surface of a respective first metal plate 484. The proximal planar surface of each first metal plate 484 is more proximal to the first substrate 908 than the sidewall surfaces of the first metal plates 484 are from the first substrate 984.

In one embodiment, sidewalls of the first metallic adhesion liner 483 and sidewalls of the first metal plate 484 may be vertically coincident within each vertical stack of a first metallic adhesion liner 483 and a first metal plate 484. In one embodiment, the first metal plates 484 (and the optional first metallic adhesion liners 483, if present) may be arranged as a periodic two-dimensional array, such as a rectangular array or a hexagonal array, having a first pitch along a first horizontal direction and having a second pitch along a second horizontal direction that may, or may not, be perpendicular to the first horizontal direction. Each of the first pitch and the second pitch may be in a range from 100 nm to 500 nm, such as from 200 nm to 300 nm, although lesser and greater pitches may also be employed. The lateral dimensions of each first metal plate 484 may be in a range from 30% to 80% of the first pitch and/or the second pitch. For example, if the first metal plates 484 have a respective horizontal cross-sectional shape of a rectangle or a rounded rectangle, the lateral distance between a parallel pair of sidewalls of each first metal plate 484 may be in a range from 30 nm to 400 nm, such as from 50 nm to 100 nm, although lesser and greater lateral distances between parallel pairs of sidewalls may also be employed.

Figure 4:
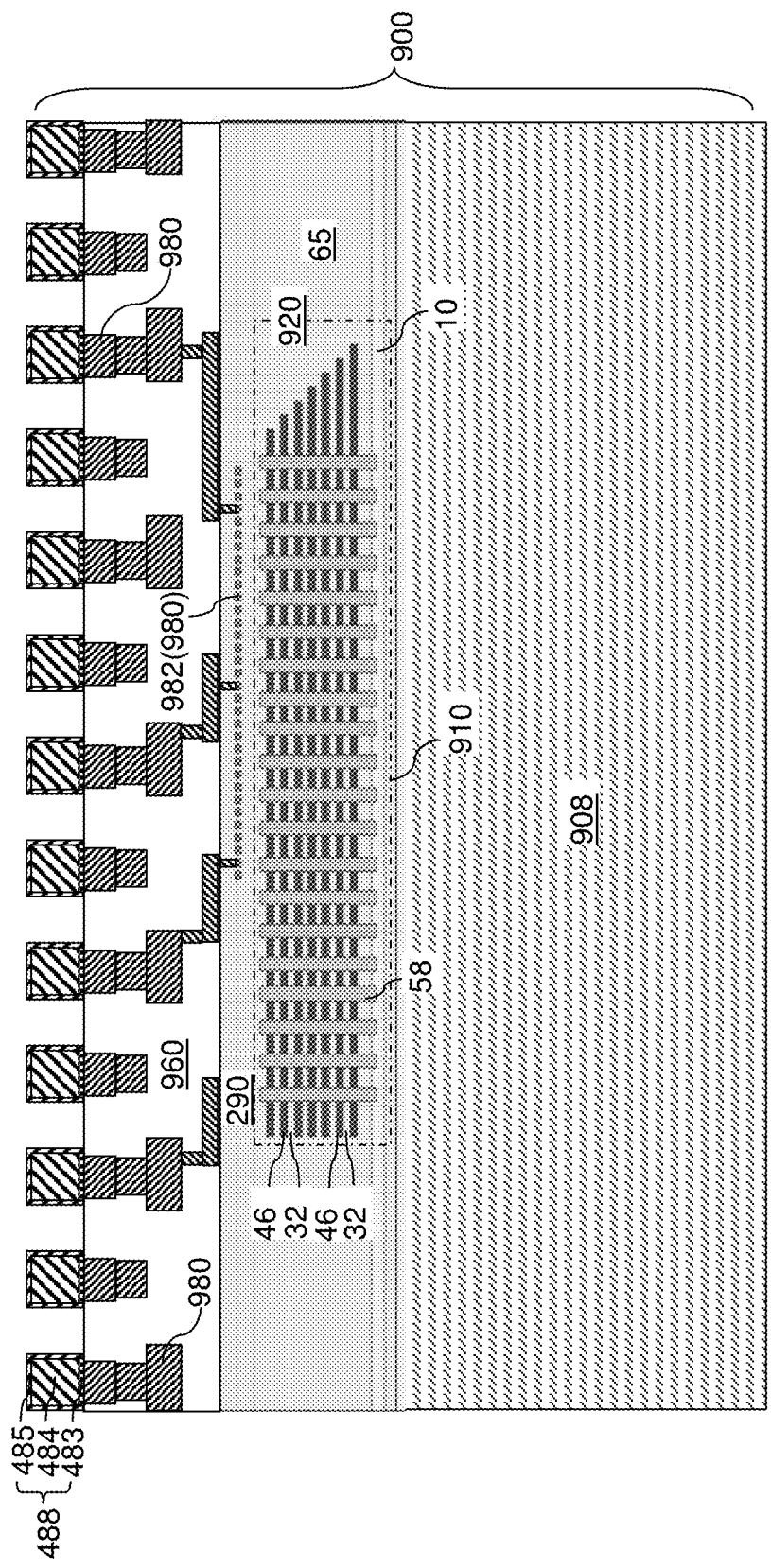
FIG. 4 is a schematic vertical cross-sectional view of the first semiconductor die after formation of first metallic capping layers according to the first embodiment of the present disclosure.

Referring to FIG. 4, first metallic capping layers 485 may be optionally formed by on the physically exposed surfaces of the first metal plates 484 and the first metallic adhesion liners 483. For example, a selective deposition process can be performed to deposit a first metallic capping material on physically exposed surfaces of the first metal plates 484 and the optional first metallic adhesion liners 483 while suppressing deposition of the first metallic capping material from dielectric surfaces such as the physically exposed surfaces of the first dielectric material layers 960. Each of the first metallic capping layers 485 can be deposited on a top surface and sidewalls of a respective one of the first metal plates 484. The selective deposition process may comprise an electroplating process, a selective chemical vapor deposition process, or a selective atomic layer deposition process. In case selective chemical vapor deposition process or a selective atomic layer deposition process is employed, an etchant that etches spurious nucleation of the first metallic capping material on dielectric surfaces can be flowed into a process chamber concurrently, or alternately, with flow of a metal-containing precursor gas. The first metallic capping material may include a material that increases electromigration resistance of the material of the first metal plates 484. For example, the first metallic capping material may comprise, and/or may consist essentially of, Co, CoW, Pd, Ti, Ru, or a refractory metal that enhances electromigration resistance. The thickness of each first metallic capping layer 485 may be in a range from 1 nm to 10 nm, such as from 2 nm to 5 nm, although lesser and greater thicknesses may also be employed.

Each contiguous combination of an optional first metallic adhesion liner 483, a first metal plate 484, and an optional first metallic capping layer 485 constitutes a first bonding pad 488. The first metallic adhesion liners 483 are optional elements, and thus, may, or may not, be present. The first metallic capping layers 485 are also optional elements, and thus, may, or may not, be present. In one embodiment, each of the first bonding pads 488 comprises a first metal plate 484 and a first metallic capping layer 485 contacting a distal planar surface (i.e., a top surface) of the first metal plate 484. The distal planar surface is more distal from the first substrate 908 than the sidewall surfaces of the first metal plate 484 are from the first substrate 908. In one embodiment, each of the first metallic capping layers 485 comprises a horizontal surface (which is a topmost surface) that is subsequently employed to directly contact, and to provide metal-to-metal bonding with, a horizontal surface of a respective one of second bonding pads to be provided in a second semiconductor die.

Figure 5:
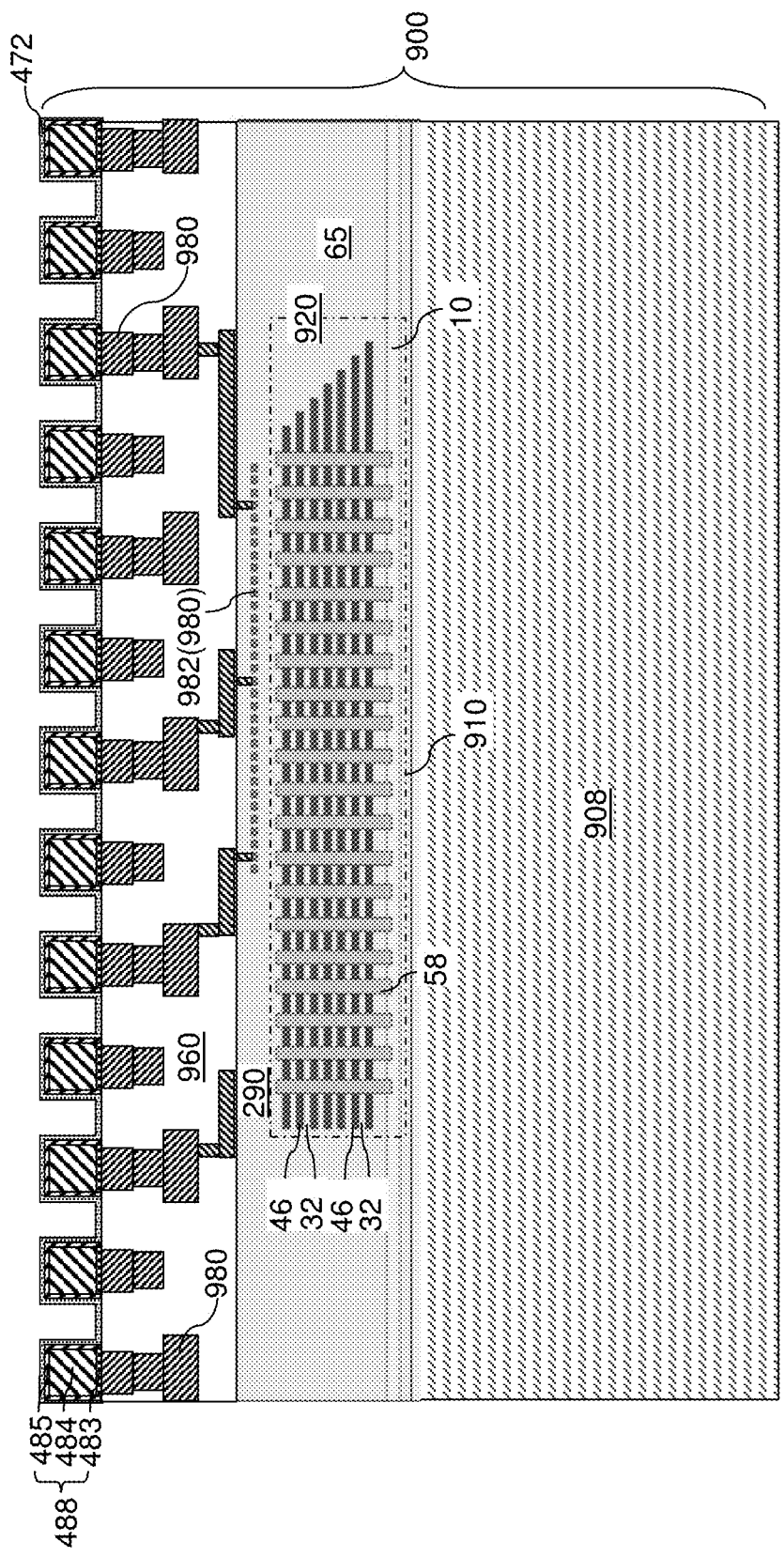
FIG. 5 is a schematic vertical cross-sectional view of the first semiconductor die after formation of a first dielectric liner according to the first embodiment of the present disclosure.

Referring to FIG. 5, a first dielectric liner 472 may be optionally deposited by a conformal deposition process on all physically exposed surfaces of the first bonding pads 488 and on all physically exposed surfaces of the first dielectric material layers 960. The first dielectric liner 472 may comprise a diffusion-blocking dielectric material such as silicon nitride, silicon oxide, silicon oxynitride, silicon oxynitride carbide, or silicon carbide nitride. Alternatively, the first dielectric liner 472 may comprise an adhesion-enhancing dielectric material such as silicon oxide. The thickness of the first dielectric liner 472 may be in a range from 1 nm to 10 nm, such as from 2 nm to 5 nm, although lesser and greater thicknesses may also be employed.

Figure 6:
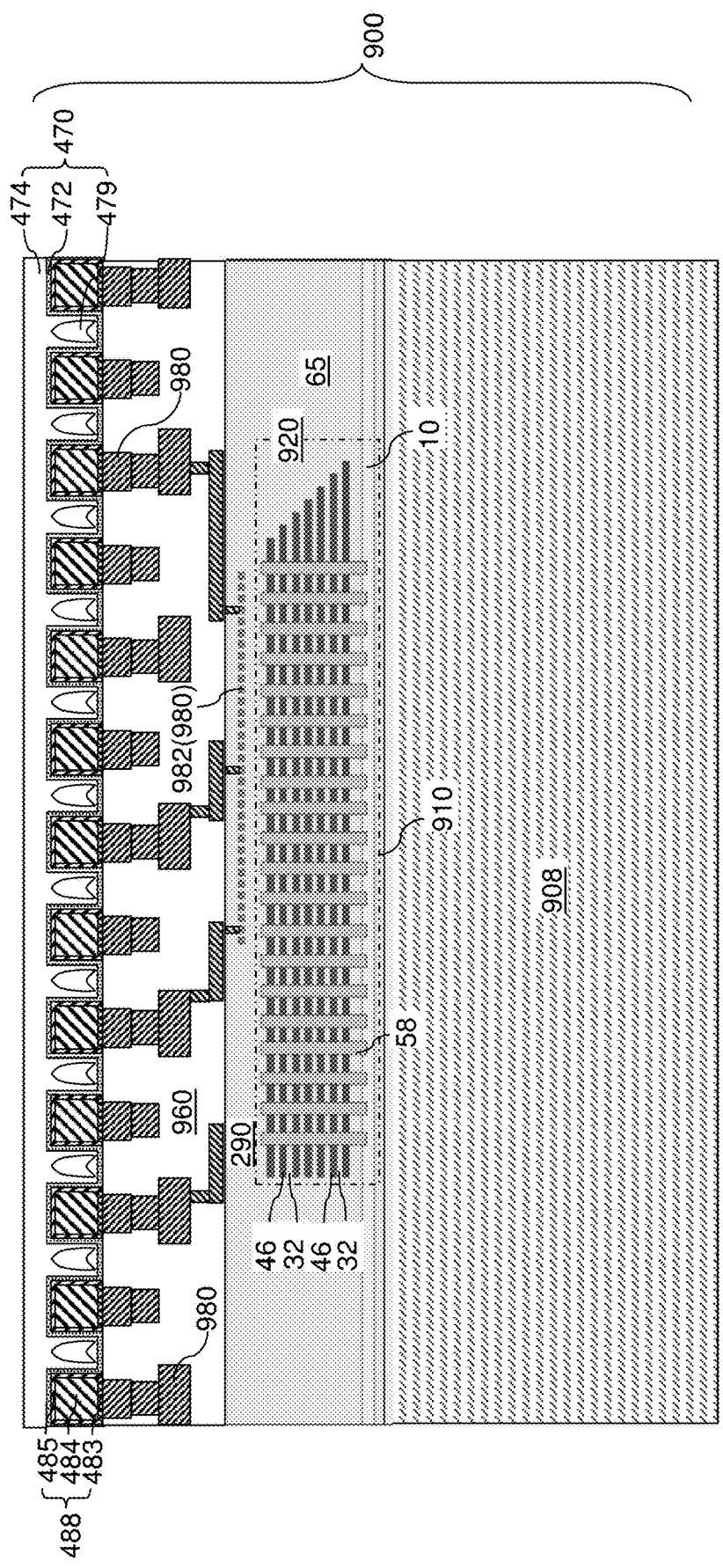
FIG. 6 is a schematic vertical cross-sectional view of the first semiconductor die after formation of a first dielectric fill material layer according to the first embodiment of the present disclosure.

Referring to FIG. 6, a first dielectric fill material can be anisotropically deposited to form a first dielectric fill material layer 474. For example, the first dielectric fill material may comprise undoped silicate glass, a doped silicate glass, silicon nitride, silicon oxynitride, silicon oxynitride carbide, silicon carbide nitride or porous or non-porous organosilicate glass. An anisotropic deposition process such as a plasma-enhanced chemical vapor deposition process (PECVD) may be employed to deposit the first dielectric fill material with directionality. The first dielectric fill material can be deposited on physically exposed surfaces of the first dielectric liner 472 or on physically exposed surfaces of the first bonding pads 488 (in case the first dielectric liner 472 is not employed) such that the thickness of vertically-extending portions of the first dielectric material over sidewalls of the first bonding pads 488 decreases with a vertical distance toward the first substrate 908 from the horizontal plane including the top surfaces of the first bonding pads 488. The thickness of horizontally-extending portions of the first dielectric fill material layer 474 overlying a respective one of the first bonding pads 488 may be in a range from 10 nm to 150 nm, such as from 20 nm to 50 nm. The lateral thickness of vertically-extending portions of the first dielectric fill material layer 474 located adjacent to a respective one of the sidewalls of the first bonding pads 488 decreases with a vertical distance from the horizontal plane including the top surfaces of the first bonding pads 488 toward the first substrate 908, and may be in a range from 1 nm to 100 nm, such as from 2 nm to 30 nm, although lesser and greater lateral thicknesses may also be employed.

According to an aspect of the present disclosure, the aspect ratio of gaps between neighboring pairs of the first bonding pads 488 and the anisotropy of the deposition process for the first dielectric material are selected such that the first dielectric fill material layer 474 is contains at least one first encapsulated airgap 479 embedded within the first dielectric fill material layer 474, which is deposited between and over the first bonding pads 488. In one embodiment, each of the at least one first encapsulated airgap 479 may be formed between neighboring pairs of the first bonding pads 488. Generally, the first dielectric fill material layer 474 can be formed by anisotropic deposition of the first dielectric fill material. Each of the at least one first encapsulated airgap 479 may be formed below a horizontal plane including top surfaces of the first bonding pads 488. In one embodiment, the at least one first encapsulated airgap 479 may be formed as a single interconnected airgap. Alternatively, the at least one first encapsulated airgap 479 may be formed as an array of discrete encapsulated airgaps.

The combination of all dielectric material portions and airgaps located above the horizontal plane including the bottommost surfaces of the first bonding pads 488 constitute a first pad-level dielectric layer 470. The first pad-level dielectric layer 470 can comprise the optional first dielectric liner 472, the first dielectric fill material layer 474, and the at least one first encapsulated airgap 479 located between neighboring pairs of first bonding pads 488 and encapsulated by a first dielectric fill material of the first pad-level dielectric layer 470, i.e., the material of the first dielectric fill material layer 474. In one embodiment, a segment and/or each segment of the at least one first encapsulated airgap 479 can have a vertical cross-sectional profile in which a lateral dimension increases with a vertical distance from a horizontal plane including the topmost surfaces (i.e., distal planar surfaces) of the first bonding pads 488.

Figure 7:
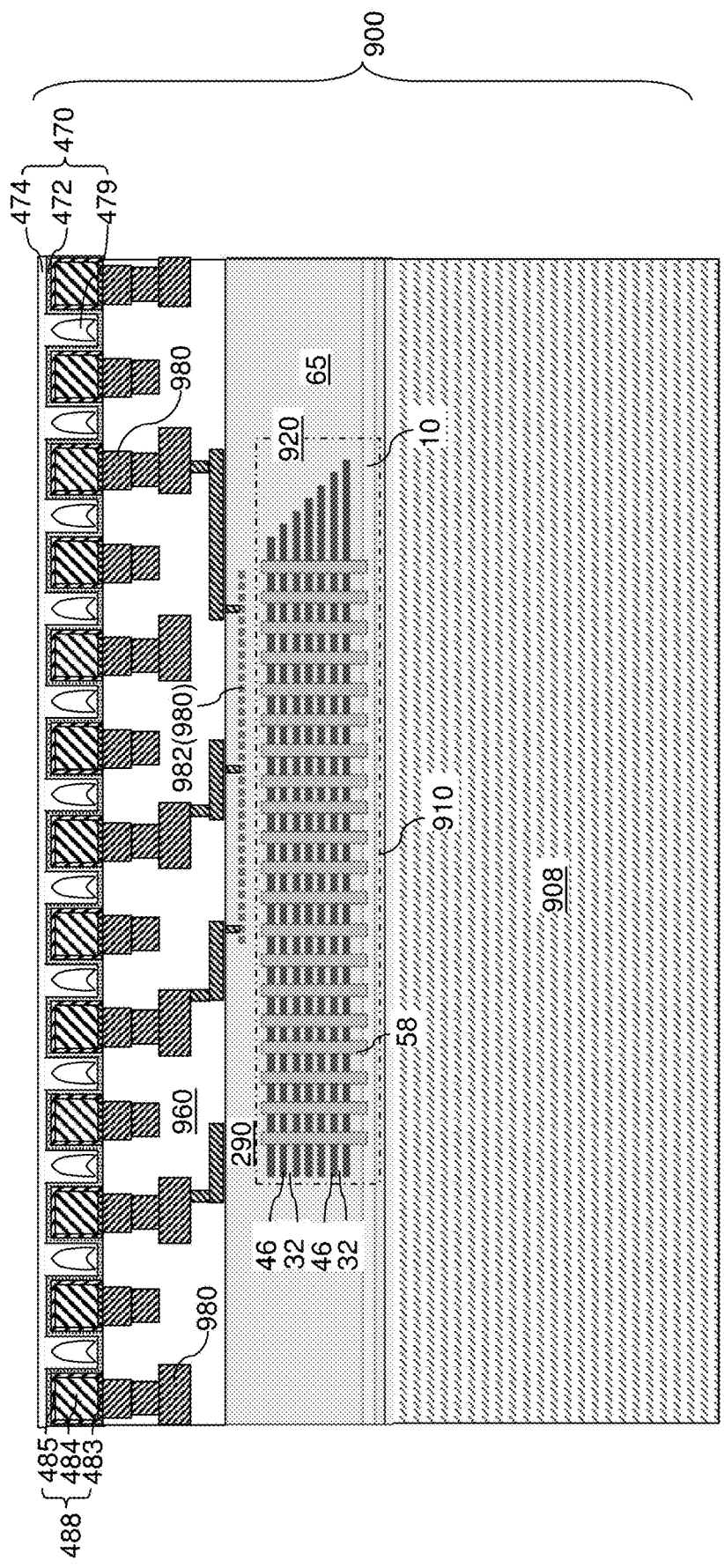
FIG. 7 is a schematic vertical cross-sectional view of the first semiconductor die after thinning the first dielectric fill material layer according to the first embodiment of the present disclosure.

Referring to FIG. 7, the top surface of the first dielectric fill material layer 474 can be vertically recessed, for example, by performing an anisotropic or an isotropic etch process such as a wet etch process. The sum of the thickness of the first dielectric liner 472 and the horizontally-extending portions of the first dielectric fill material layer 474 that overlie the first bonding pads 488 can be selected such that the volume expansion of the first bonding pads 488 during a subsequent bonding process causes the top surfaces of the first bonding pads to rise to the horizontal plane including the recessed surface of first dielectric fill material layer 474. For example, the sum of the thickness of the first dielectric liner 472 and the horizontally-extending portions of the first dielectric fill material layer 474 that overlie the first bonding pads 488 after the recess process can be in a range from 20 nm to 50 nm, although lesser and greater thicknesses may also be employed.

Figure 8A:
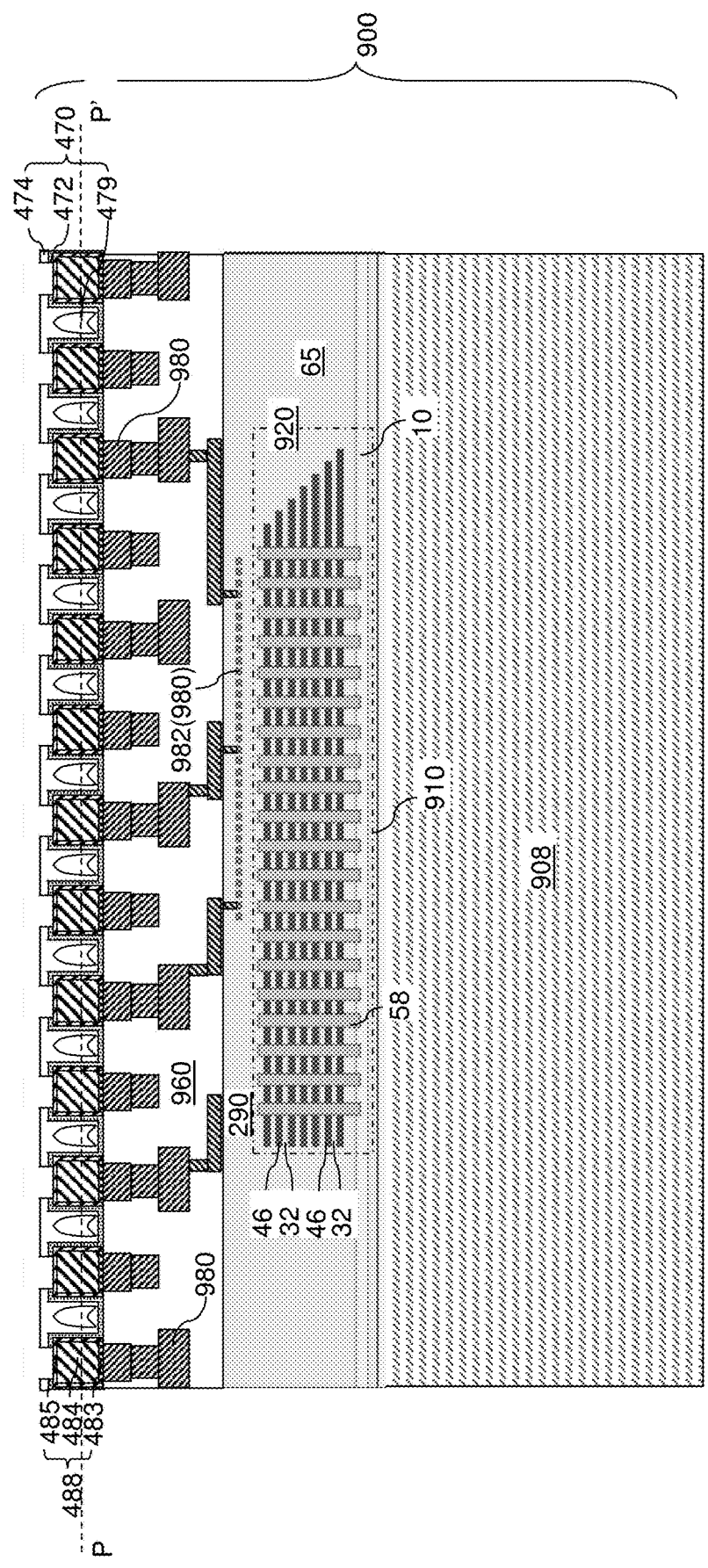
FIG. 8A is a schematic vertical cross-sectional view of the first semiconductor die after forming openings through the first dielectric fill material layer and the first dielectric liner according to the first embodiment of the present disclosure. The plane P-P' corresponds to the view shown in FIGS. 8B and 8C.
Figure 8B:
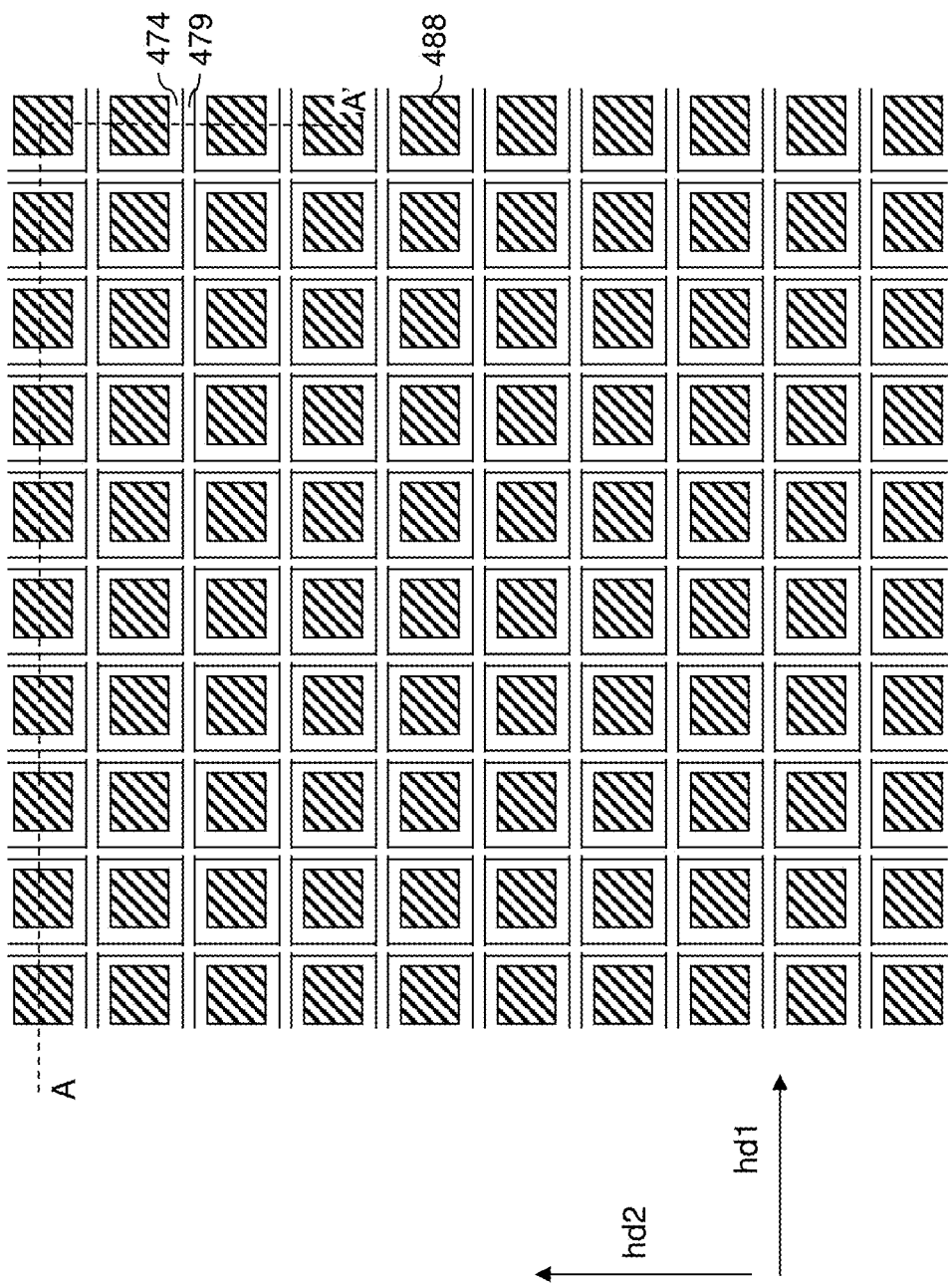
FIG. 8B is a schematic horizontal cross-sectional view of a first configuration of the first semiconductor die of FIG. 8A along a horizontal plane P-P' passing through the first bonding pads. The plane A-A' corresponds to the view shown in FIG. 8A.
Figure 8C:
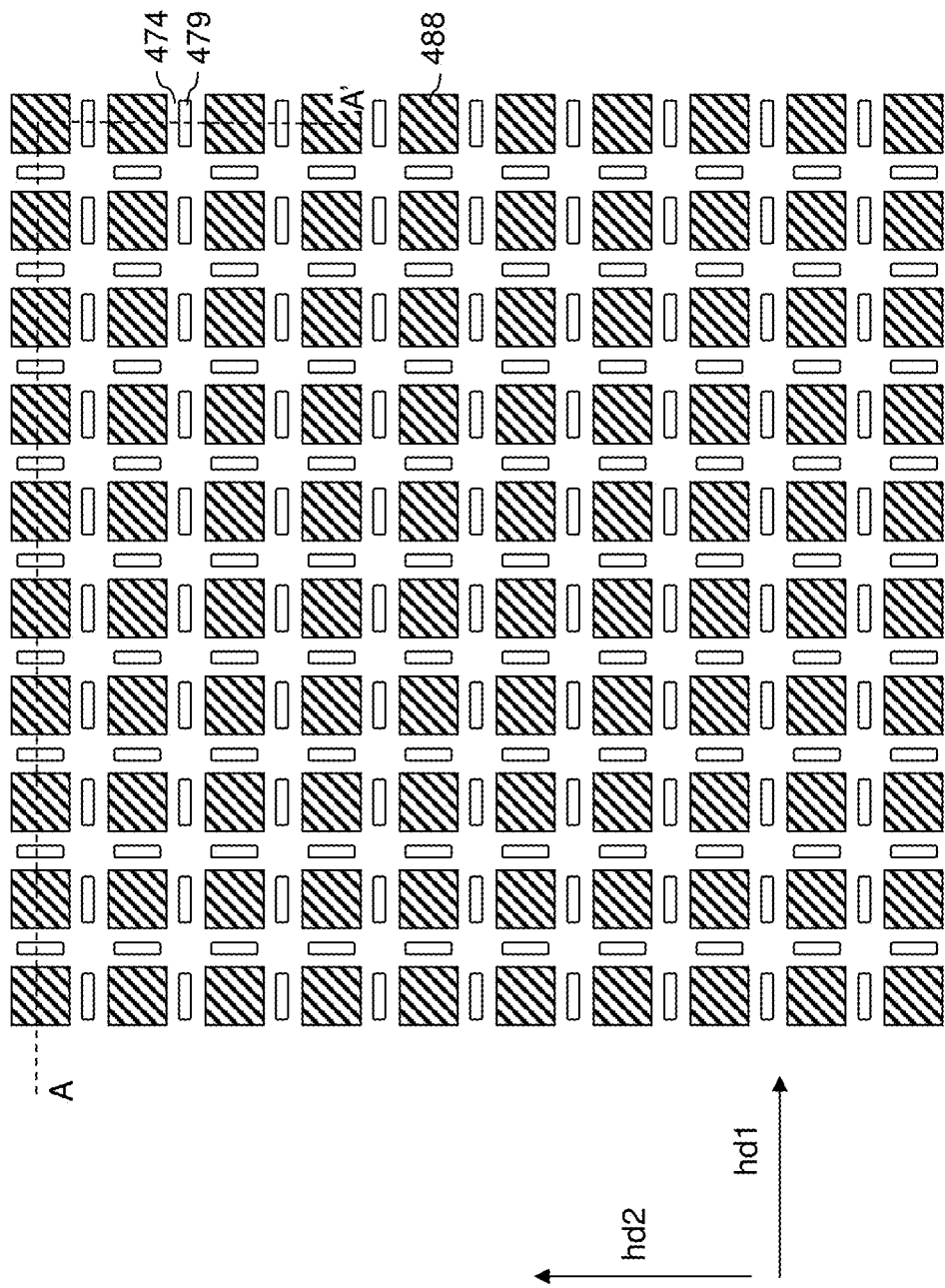
FIG. 8C is a schematic horizontal cross-sectional view of a second configuration of the first semiconductor die of FIG. 8A along a horizontal plane P-P' passing through the first bonding pads. The plane A-A' corresponds to the view shown in FIG. 8A.

Referring to FIGS. 8A-8C, a photoresist layer (not shown) can be applied over the first pad-level dielectric layer 470, and can be lithographically patterned to form openings over the first bonding pads 488. In one embodiment, each of the openings in the photoresist layer can have a respective periphery that is laterally offset inward from sidewalls of a respective underlying first bonding pad 488 by a lateral offset distance. The lateral offset distance may be in a range from 0.5 percent to 40% of a lateral distance between parallel pairs of sidewalls of the respective underlying first bonding pad 488, or of the diameter or a major axis of the horizontal cross-sectional shape of the respective underlying first bonding pad 488 (in case the horizontal cross-sectional shape is a circular shaper or an elliptical shape). Alternatively, the peripheries of the openings in the photoresist layer may be located within vertical planes including sidewalls of the first bonding pads 488.

An etch process (such as an anisotropic etch process or an isotropic etch process) can be performed to etch portions of the first dielectric fill material layer 474 and the optional first dielectric liner 472 that are not masked by the photoresist layer. Openings are formed through the first dielectric fill material layer 474 and the first dielectric liner 472, and top surfaces of the first bonding pads 488 are physically exposed. Generally, openings are formed through portions of the first dielectric liner 472 that overlie the top surfaces of the first bonding pads 488.

In a first configuration of the first semiconductor die 900, the at least one first encapsulated airgap 479 may comprise a first continuous encapsulated airgap having a configuration of a two-dimensional intersecting grid of first airgap segments that laterally extend along a first horizontal direction hd1 and second airgap segments that laterally extend along a second horizontal direction hd2 as illustrated in FIG. 8B. In one embodiment, the first bonding pads 488 may have a two-dimensional periodicity, and the first continuous encapsulated airgap may have the same two-dimensional periodicity as the first bonding pads 488.

In a second configuration of the first semiconductor die 900, the at least one first encapsulated airgap 479 comprises a two-dimensional array of discrete first encapsulated airgaps having a first periodicity along a first horizontal direction hd1 and having a second periodicity along a second horizontal direction hd2 as illustrated in FIG. 8C. In one embodiment, the first bonding pads 488 may have a two-dimensional periodicity, and the two-dimensional array of discrete first encapsulated airgaps may have the same two-dimensional periodicity as the first bonding pads 488.

In one embodiment, the first pad-level dielectric layer 470 may comprise a first dielectric liner 472, which comprises vertically-extending portions that laterally surround and contact a respective one of the first bonding pads 488 and a horizontally-extending portion adjoined to proximal ends of the vertically-extending portions and contacting a most distal layer among the first dielectric material layers 960. In this case, the first dielectric fill material and the at least one first encapsulated airgap 479 are spaced from the first bonding pads 488 and from the first semiconductor devices 920 by the first dielectric liner 472.

Figure 9:
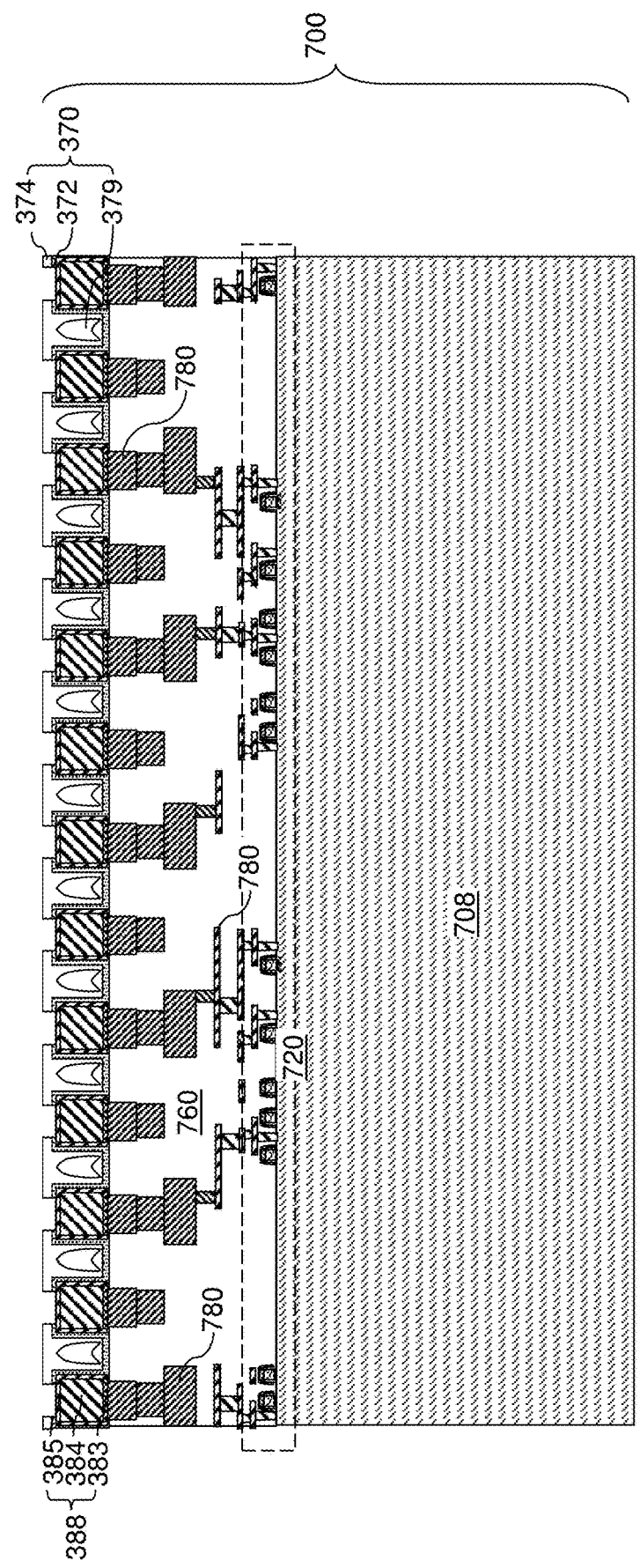
FIG. 9 is a schematic vertical cross-sectional view of a second semiconductor die for forming the first exemplary bonded assembly after forming openings through a second dielectric fill material layer and a second dielectric liner according to the first embodiment of the present disclosure.

Referring to FIG. 9, a second semiconductor die 700 according to an embodiment of the present disclosure is illustrated. The second semiconductor die 700 includes a second substrate 708, second semiconductor devices 720 overlying the second substrate 708, second dielectric material layers 760 overlying the second semiconductor devices 720, and second metal interconnect structures 780 embedded in the second dielectric material layers 760. In one embodiment, the second semiconductor devices 720 may include at least one complementary metal oxide semiconductor (CMOS) circuitry including field effect transistors. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices 920 in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers 760 embed the second metal interconnect structures 780. The second dielectric material layers 760 may include a dielectric material such as undoped silicate glass (e.g., silicon oxide), a doped silicate glass, organosilicate glass, silicon nitride, a dielectric metal oxide, or a combination thereof.

Second bonding pads 388 and a second pad-level dielectric layer 370 can be formed employing the same methods described above that are employed to form the first bonding pads 488 and the first pad-level dielectric layer 470. The second bonding pads 388 can be formed in a mirror image pattern of the pattern of the first bonding pads 488. Each of the second bonding pads 388 may comprise an optional second metallic adhesion liner 383, a second metal plate 384, and an optional second metallic capping layer 385. The second pad-level dielectric layer 370 may comprise an optional second dielectric liner 372, a second dielectric fill material layer 374 including a second dielectric fill material, and at least one second encapsulated airgap 379, which may have the configuration of the first continuous encapsulated airgap illustrated in FIG. 8B, or may have a configuration of a two-dimensional array of discrete first encapsulated airgaps illustrated in FIG. 8C.

Generally, the second metallic adhesion liners 383 may have any material composition that may be employed for the first metallic adhesion liners 483, and may have the same thickness range as the first metallic adhesion liners 483. The second metal plates 384 may have any material composition that may be employed for the first metal plates 484, and may have the same thickness range as the first metal plates 484. The second metallic capping layers 385 may have any material composition that may be employed for the first metallic capping layers 485, and may have the same thickness range as the first metallic capping layers 485. The second dielectric liner 372 may have any material composition that may be employed for the first dielectric liner 472, and may have the same thickness range as the first dielectric liner 472. The second dielectric fill material may include any material that may be employed for the first dielectric fill material. In one embodiment, the first dielectric fill material and the second dielectric fill material are selected such that high adhesion strength may be obtained between the first dielectric material and the second dielectric material after a subsequent bonding process. The at least one second encapsulated airgap 379 may have the same geometry as the at least one first encapsulated airgap 479.

The second semiconductor die 700 comprises the second substrate 708, the second semiconductor devices 720, and second bonding pads 388 that are electrically connected to a respective node of the second semiconductor devices 720 and laterally surrounded by the second pad-level dielectric layer 370. The second pad-level dielectric layer 370 may comprise at least one second encapsulated airgap 379 located between neighboring pairs of second bonding pads 388 and encapsulated by the second dielectric fill material of the second pad-level dielectric layer 370, which is the second dielectric fill material of the second dielectric fill material layer 374. The second dielectric fill material layer 374 includes a continuously-extending portion of the second dielectric fill material that encapsulates each of the at least one second encapsulated airgap 379. The at least one second encapsulated airgap 379 can be located between neighboring pairs of the second bonding pads 388, and can be encapsulated by the continuously-extending portion of the second dielectric fill material.

Figure 10:
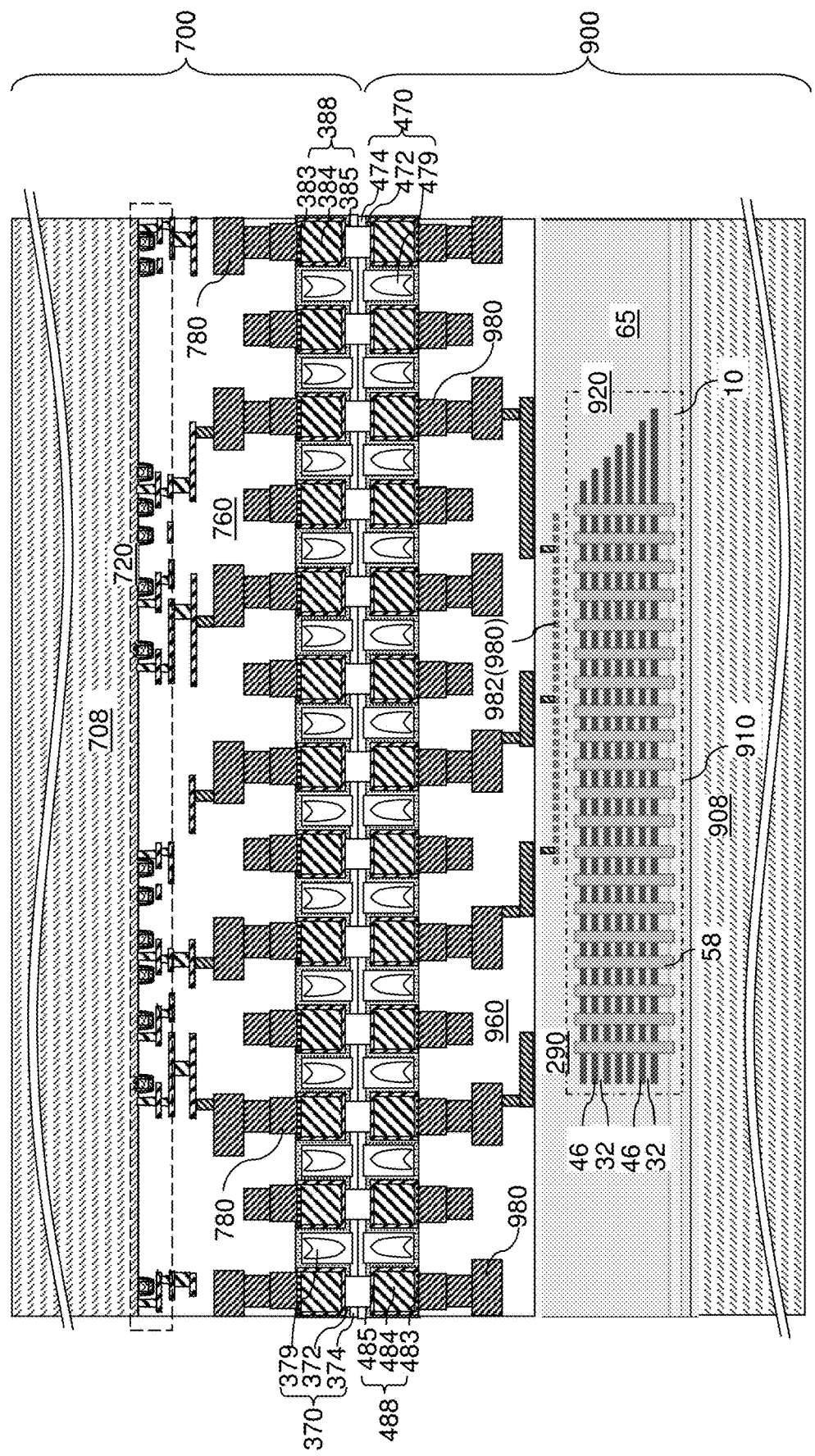
FIG. 10 is a schematic vertical cross-sectional view of a first exemplary structure including the first semiconductor die and the second semiconductor die after disposing the first semiconductor die on the second semiconductor die according to the first embodiment of the present disclosure.

Referring to FIG. 10, the first semiconductor die 900 and the second semiconductor die 700 are oriented such that the first bonding pads 488 face the second bonding pads 388, and the first pad-level dielectric layer 470 faces the second pad-level dielectric layer 370. The second semiconductor die 700 and the first semiconductor die 900 are brought into contact such that a horizontal surface of the first pad-level dielectric layer 470 contacts a horizontal surface of the second pad-level dielectric layer 370, and each of the second bonding pads 388 faces, and has an areal overlap in a plan view with, a respective one of the first bonding pads 488. In one embodiment, the pattern of the second bonding pads 388 may be a mirror image of the pattern of the first bonding pads 488 with optional differences in the size of bonding pads between the first semiconductor die 900 and the second semiconductor die 700. In one embodiment, the first bonding pads 488 and the corresponding second bonding pads 388 may have the same size (i.e., lateral width). In another embodiment, the first bonding pads 488 and the corresponding second bonding pads 388 may have different sizes. In one embodiment, areal overlap between each facing pair of a first bonding pad 488 and a second bonding pad 388 may be at least 80%, and/or at least 90%, such as 90 to 100%, of the area of the smaller one of the first bonding pad 488 and the second bonding pad 388. Gaps are present between each mating pair of a first bonding pad 488 and a second bonding pad 388.

Figure 11:
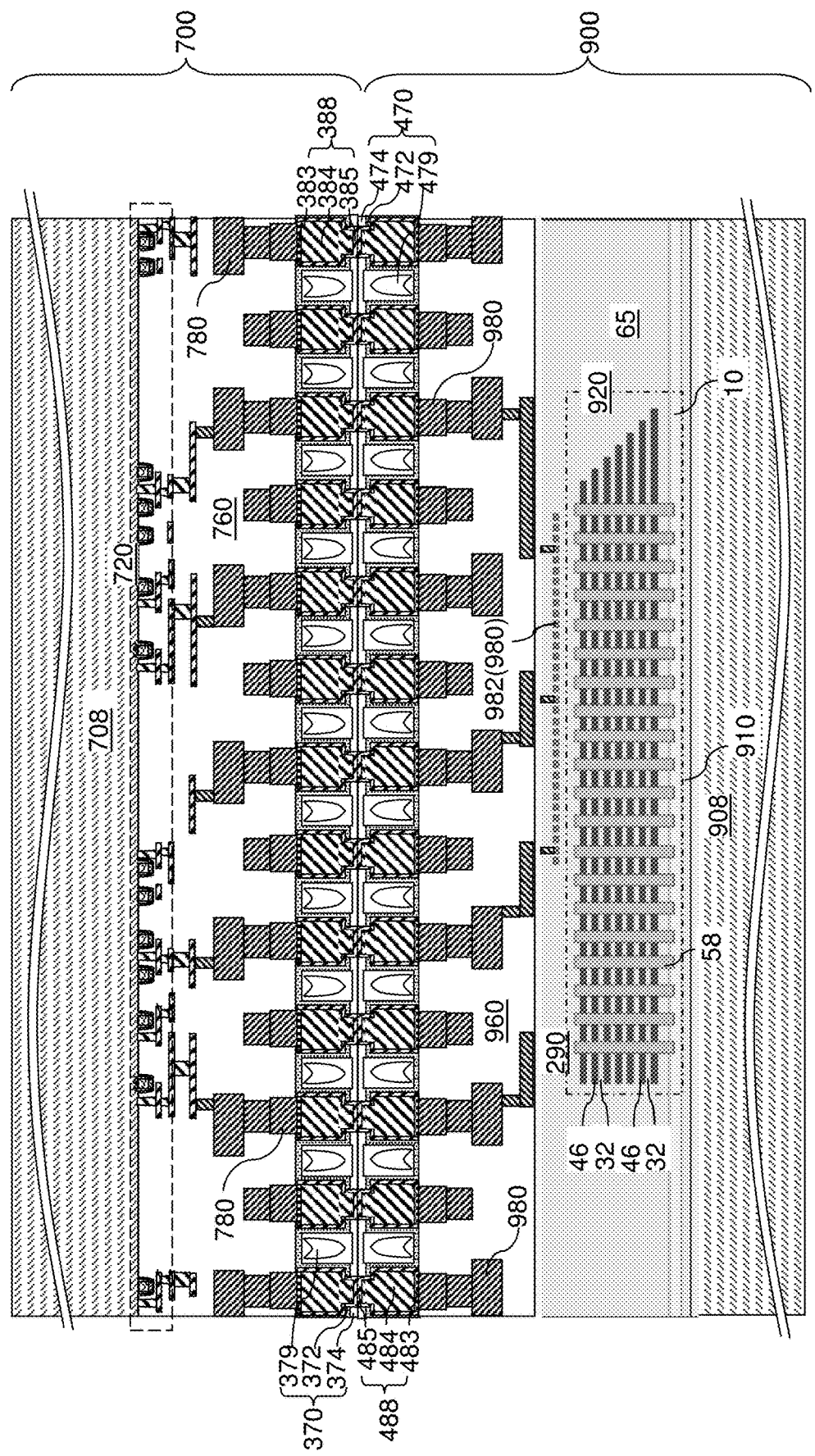
FIG. 11 is a schematic vertical cross-sectional view of the first exemplary structure after bonding the first semiconductor die to the second semiconductor die according to the first embodiment of the present disclosure.

Referring to FIG. 11, the second bonding pads 388 may be bonded to the first bonding pads 488 by performing an anneal process that induces metal-to-metal bonding between the second bonding pads 388 and the first bonding pads 488. The anneal process may also optionally induce dielectric-to-dielectric bonding between the first dielectric fill material layer 474 and the second dielectric fill material layer 374. The anneal temperature may be selected based on the composition of the second bonding pads 388 and the first bonding pads 488. For example, if the second bonding pads 388 and the first bonding pads 488 include metal plates (384, 484) that consist essentially of copper, the anneal temperature may be in a range from 150 degrees Celsius to 400 degrees Celsius, such as from 300 degrees Celsius to 350 degrees Celsius. The first bonding pads 488 and the second bonding pads 388 thermally expand in volume such that surfaces of the first bonding pads 488 contact surfaces of the second bonding pads 388 at, or near, the horizontal plane including the interface between the first dielectric fill material layer 474 and the second dielectric fill material layer 374. The bonding interfaces between the first bonding pads 488 and the second bonding pads 388 are formed at, or in proximity to, the horizontal plane including the interface between the first dielectric fill material layer 474 and the second dielectric fill material layer 374. In one embodiment, the first dielectric fill material layer 474 may be bonded to the second dielectric fill material layer 374 during the anneal process. In one embodiment, bonding portions of the first dielectric fill material to a dielectric material in the second semiconductor die 700 (such as the second dielectric fill material) may occur prior to, concurrently with, or after, bonding the first bonding pads 488 to the second bonding pads 388. In one embodiment, bonding portions of the second dielectric fill material to a dielectric material in the first semiconductor die 900 (such as the first dielectric fill material) may occur prior to, concurrently with, or after, bonding the first bonding pads 488 to the second bonding pads 388.

In one embodiment, each of the first bonding pads 488 comprises a first metal plate 484 and a first metallic capping layer 485 contacting a distal planar surface of the first metal plate 484. The distal planar surface of the first metal plate 484 can be more distal from the first substrate 908 than the sidewall surfaces of the first metal plate 484 are from the first substrate 908. In one embodiment, each of the first metallic capping layers 485 comprises a horizontal surface that directly contacts and provides metal-to-metal bonding with a horizontal surface of a respective one of the second bonding pads 388. The horizontal surface of the respective one of the second bonding pads 388 may be a horizontal surface of a second metallic capping layer 385, or a horizontal surface of a second metal plate 384 in case a second metallic capping layer is not employed.

In one embodiment, each of the second bonding pads 388 comprises a second metal plate 384 and a second metallic capping layer 385 contacting a distal planar surface of the second metal plate 384. The distal planar surface of the second metal plate 384 can be more distal from the second substrate 708 than the sidewall surfaces of the second metal plate 384 are from the second substrate 708. In one embodiment, each of the second metallic capping layers 385 comprises a horizontal surface that directly contacts and provides metal-to-metal bonding with a horizontal surface of a respective one of the first bonding pads 488. The horizontal surface of the respective one of the first bonding pads 488 may be a horizontal surface of a first metallic capping layer 485, or a horizontal surface of a first metal plate 484 in case a first metallic capping layer is not employed.

Figure 12:
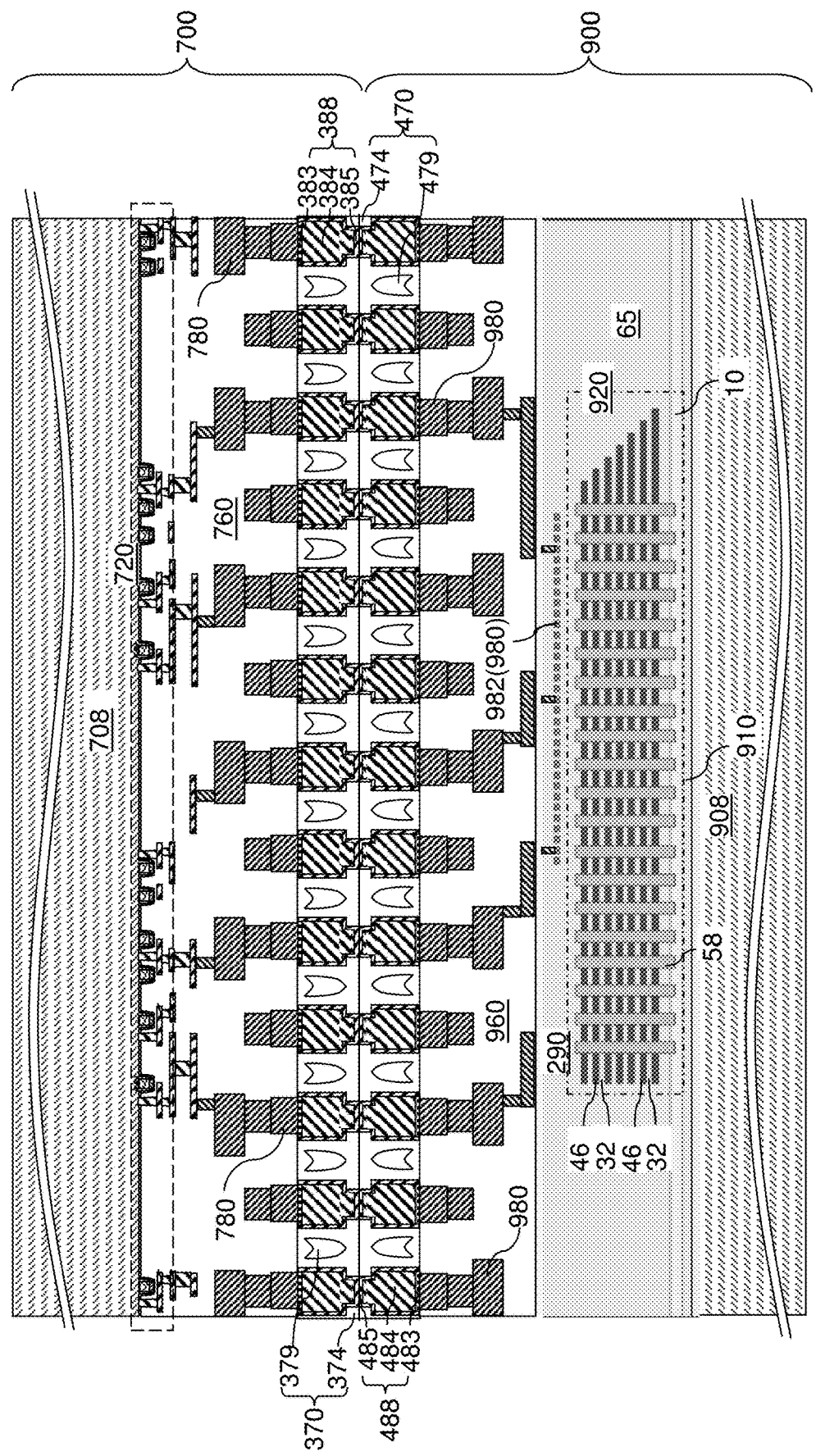
FIG. 12 is a schematic vertical cross-sectional view of a first alternative configuration of the first exemplary structure after bonding the first semiconductor die to the second semiconductor die according to the first embodiment of the present disclosure.

Referring to FIG. 12, a first alternative configuration of the first exemplary structure is illustrated, which can be derived from the first exemplary structure of FIG. 11 by omitting formation of the first dielectric liner 472 and/or formation of the second dielectric liner 372.

Figure 13:
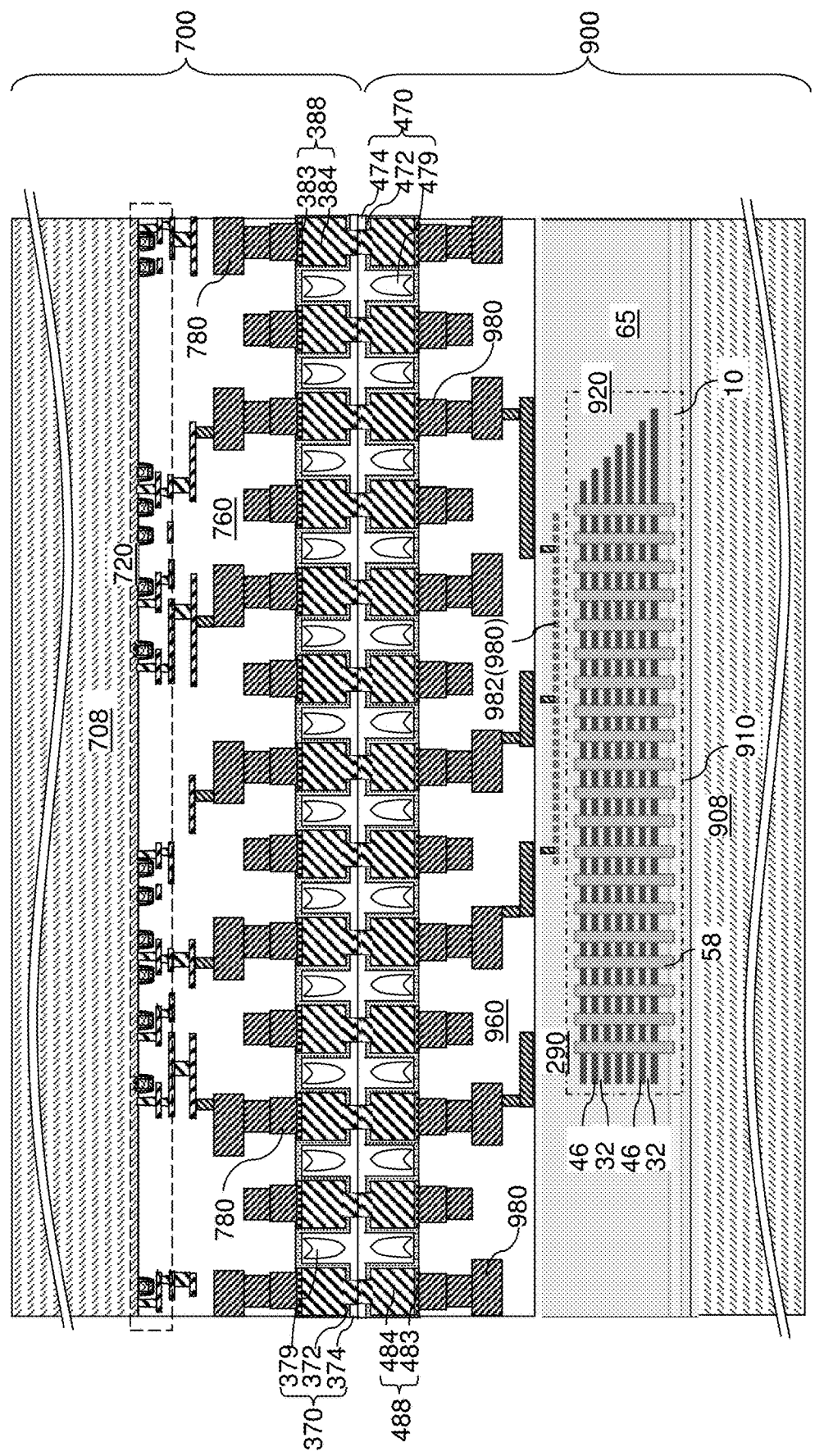
FIG. 13 is a schematic vertical cross-sectional view of a second alternative configuration of the first exemplary structure after bonding the first semiconductor die to the second semiconductor die according to the first embodiment of the present disclosure.

Referring to FIG. 13, a second alternative configuration of the first exemplary structure can be derived from the first exemplary structure of FIG. 11 or from the first alternative configuration of the first exemplary structure of FIG. 12 by omitting formation of first metallic capping layers 485 and/or formation of the second metallic capping layers 385.

Figure 14:
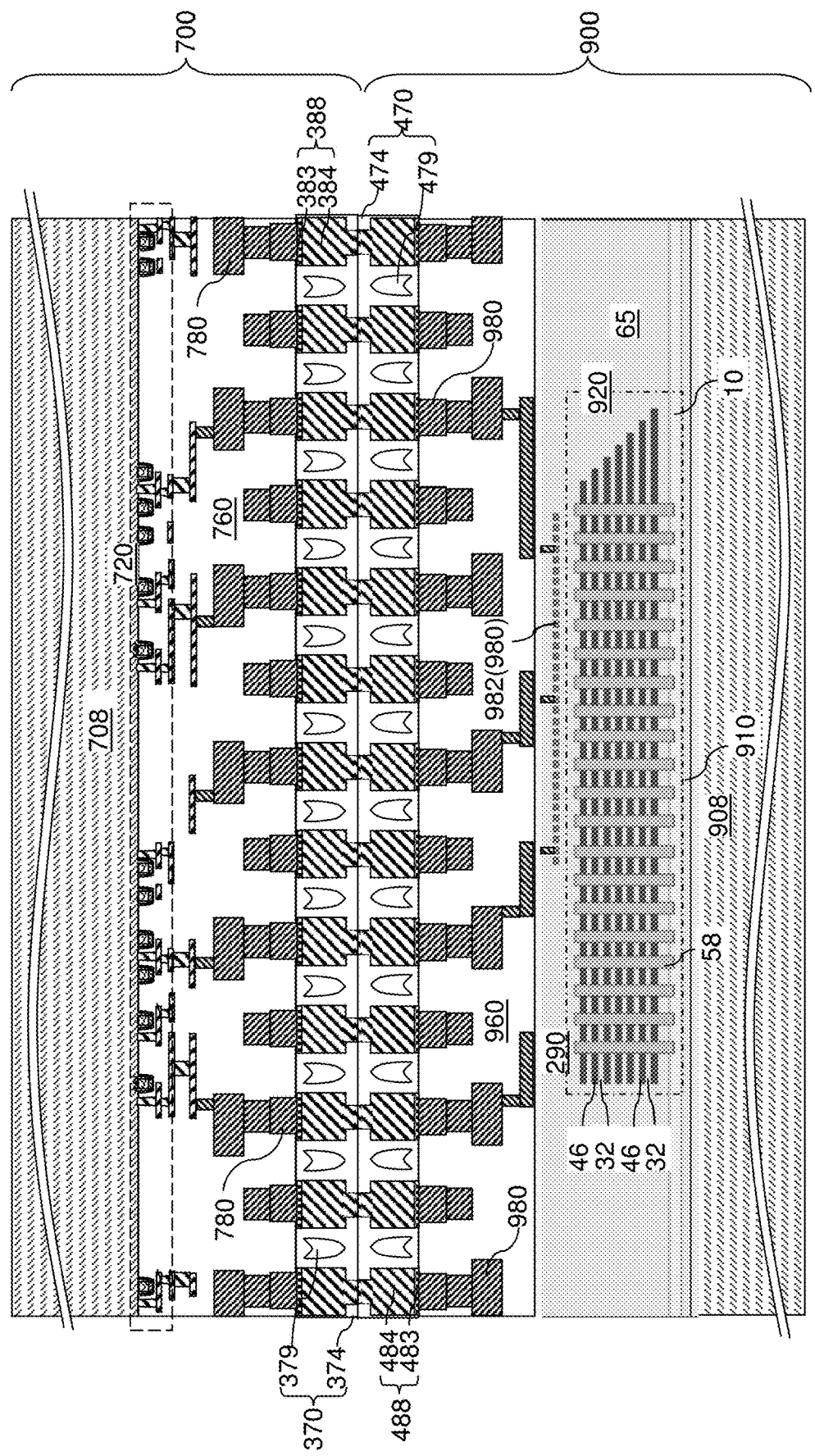
FIG. 14 is a schematic vertical cross-sectional view of a third alternative configuration of the first exemplary structure after bonding the first semiconductor die to the second semiconductor die according to the first embodiment of the present disclosure.

Referring to FIG. 14, a third alternative configuration of the first exemplary structure can be derived from the first exemplary structure of FIG. 11 by omitting formation of the first dielectric liner 472 and/or formation of the second dielectric liner 372, and by omitting formation of first metallic capping layers 485 and/or formation of the second metallic capping layers 385.

Figure 15:
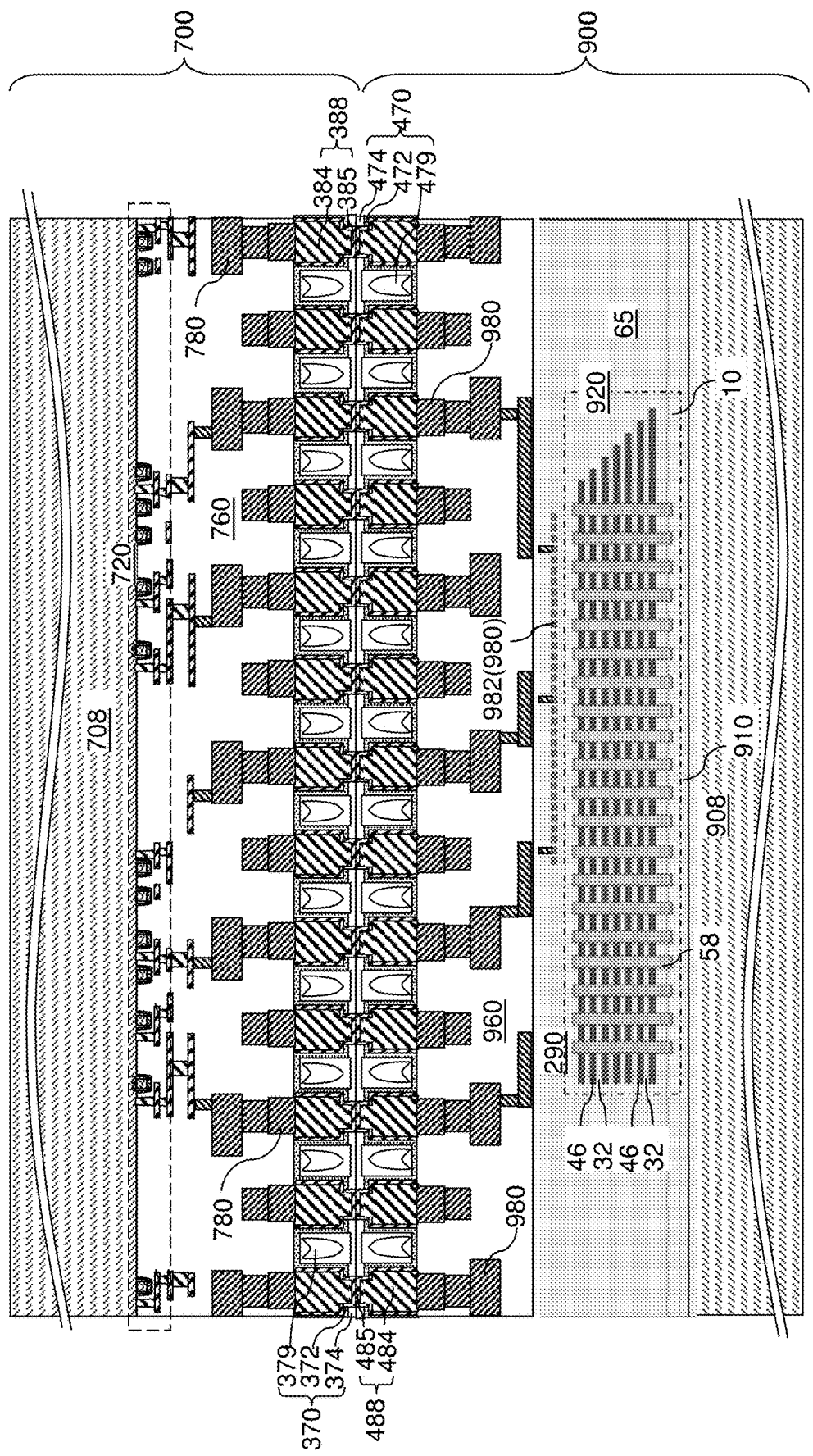
FIG. 15 is a schematic vertical cross-sectional view of a fourth alternative configuration of the first exemplary structure after bonding the first semiconductor die to the second semiconductor die according to the first embodiment of the present disclosure.

Referring to FIG. 15, a fourth alternative configuration of the first exemplary structure can be derived from the first exemplary structure of FIG. 11 or from alternative configurations of the first exemplary structure of FIGS. 12, 13, and 14 by omitting formation of the first metallic adhesion liners 483 and/or the second metallic adhesion liners 383.

In a conventional die bonding scheme, chemical mechanical polishing (CMP) may induce voids in the bonding pads, such as voids located in the top and/or bottom pad sidewalls. Without wishing to be bound by a particular theory, it is believed that such voids occur mainly due to galvanic corrosion and etching rate difference of copper and barrier materials of the bonding pads during the CMP step. After bonding, these voids accumulate at one side of the bonding pad, leading to device failure. Furthermore, electro-migration with the stress current flowing up (electron wind flowing down) may exacerbate this void problem. The copper in the top pad may be driven down by electron wind, such that the copper moves down and then moves laterally in the bottom pad. The empty volume at the bonding interface is filled up with the moved copper, while the voids may migrate to the bonding interface and then move up. The voids may accumulate at the bottom of the top pad and create open interconnection. The void accumulation issue could be worse for finer pitch bonding pads having a pitch of 500 nm or less because the sidewall/pad area is reduced. Therefore it becomes easier for material diffusion along sidewall to accumulate void.

In contrast, in the first embodiment of the present disclosure, the metal (e.g., copper) layer deposition precedes the dielectric material deposition, and the metal layer may be patterned into the plates 484 by direct metal etching. Therefore, the CMP process may be omitted after formation of the bonding pads 488. Since the CMP process is omitted, the voids on the sidewalls of the bonding pads 488 are reduced or eliminated, which improves the device reliability and improves electromigration performance. In the first embodiment, there is no need to deposit copper into openings in a dielectric layer. Therefore the adhesion layer 483 is an optional layer and may be omitted to simplify the process. For some dielectrics, such as SiCN and SiN, no barrier layer for the copper plates 484 are needed. Likewise, a liner between the copper plates 484 and the dielectric is optional and may be omitted to simplify the process. The use of airgaps between the bonding pads 488 reduce the capacitance between adjacent bonding pads 488.

Figure 16:
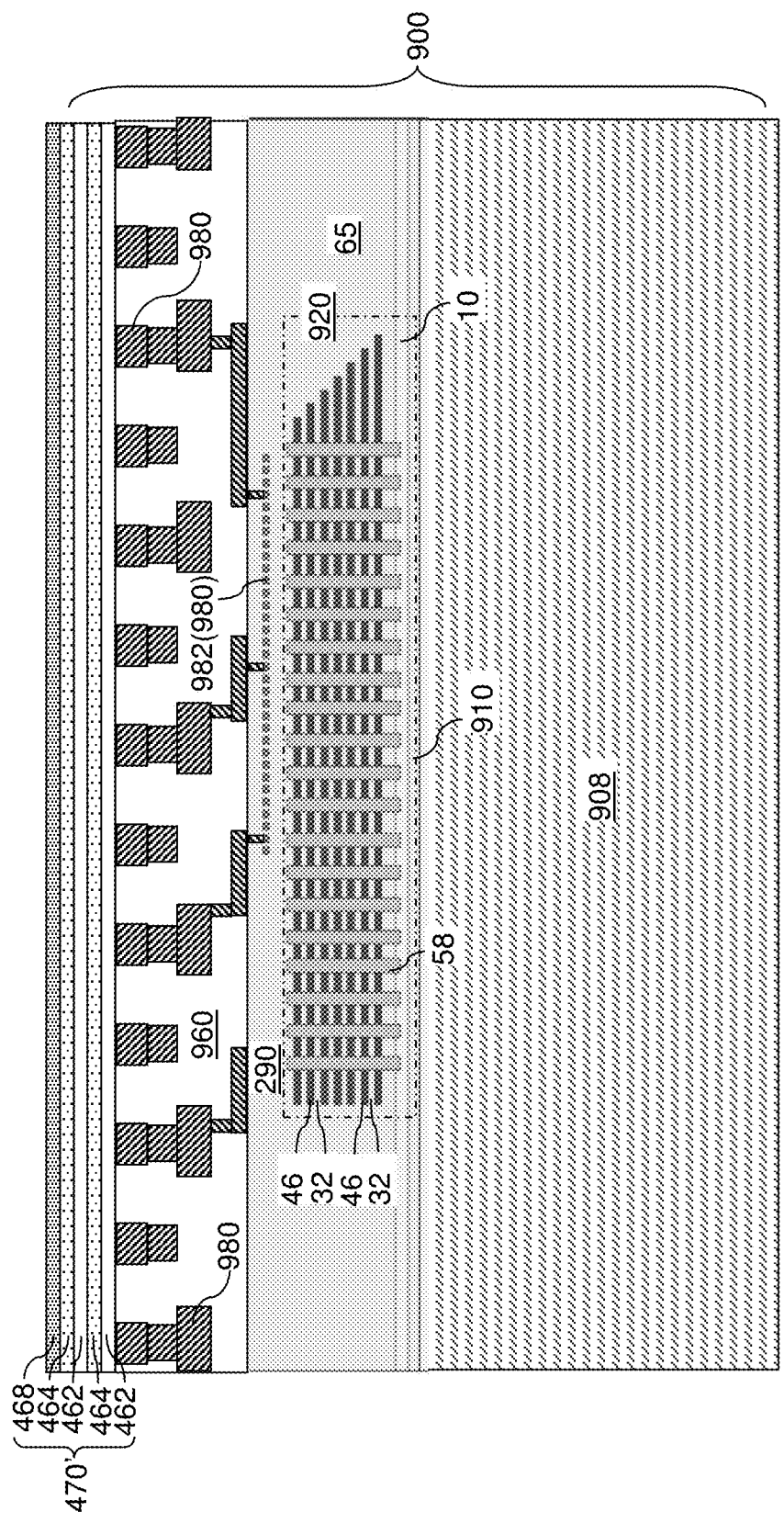
FIG. 16 is a schematic vertical cross-sectional view of a first semiconductor die for forming a second exemplary bonded assembly after formation of first dielectric etch stop layers, first dielectric matrix layers, and a first dielectric capping layer according to a second embodiment of the present disclosure.

Referring to FIG. 16, a first semiconductor die 900 for forming a second exemplary bonded assembly according to a second embodiment of the present disclosure can be derived from the first semiconductor die 900 illustrated in FIG. 1 by forming a layer stack 470' including at least one first dielectric etch stop layer 462, at least one first dielectric matrix layer 464, and a first dielectric capping layer 468. The total thickness of the layer stack 470' may be in a range from 50 nm to 1,000 nm, such as from 200 nm to 500 nm, although lesser and greater thicknesses may also be employed.

The at least one first dielectric matrix layer 464 may include a single first dielectric matrix layer 464, or may include a plurality of first dielectric matrix layers 464 that are vertically spaced apart from each other by the at least one first dielectric etch stop layer 462. The at least one first dielectric matrix layer 464 includes a dielectric material layer that can be subsequently isotropically etched. For example, the at least one first dielectric matrix layer 464 may include undoped silicate glass, borosilicate glass, borophosphosilicate glass, organosilicate glass, silicon nitride, silicon oxynitride, silicon oxynitride carbide or silicon nitride carbide. The thickness of each first dielectric matrix layer 464 may be in a range from 10 nm to 400 nm, such as from 20 nm to 200 nm, although lesser and greater thicknesses may also be employed.

The at least one first dielectric etch stop layer 462 is an optional material layer, and thus, may, or may not, be present. The at least one first dielectric etch stop layer 462 may include a single first dielectric etch stop layer 462, or may include a plurality of first dielectric etch stop layers 462 that are vertically spaced apart among one another by the at least one first dielectric matrix layer 464. The at least one first dielectric etch stop layer 462 includes a dielectric material that can function as an etch stop layer during subsequent isotropic etching of the at least one first dielectric matrix layer 464. For example, the at least one first dielectric etch stop layer 462 may comprise silicon carbide nitride or silicon nitride (in case the at least one first dielectric etch stop layer 462 comprises doped or undoped silicon oxide), or undoped silicate glass (i.e., silicon oxide, in case the at least one first dielectric etch stop layer 462 comprises borosilicate glass, borophosphosilicate glass, organosilicate glass, silicon nitride, silicon oxynitride, silicon oxynitride carbide or silicon nitride carbide). The thickness of each first dielectric etch stop layer 462 may be in a range from 5 nm to 100 nm, such as from 10 nm to 50 nm, although lesser and greater thicknesses may also be employed.

The first dielectric capping layer 468 may comprise a diffusion-blocking dielectric material such as silicon carbide nitride, or an adhesion-enhancing dielectric material such as silicon oxide. The thickness of the first dielectric capping layer 468 may be in a range from 3 nm to 100 nm, such as from 10 nm to 50 nm, although lesser and greater thicknesses may also be employed.

While the structure of the embodiment of FIG. 16 contains two first dielectric matrix layers 464, embodiments are expressly contemplated in which the total number of the at least one first dielectric matrix layer 464 is one, three, or four or more. Further, while the structure of the embodiment of FIG. 16 contains two dielectric etch stop layers 462, embodiments are expressly contemplated in which the total number of the at least one first dielectric etch stop layer 462 is zero, one, three, or four or more. Generally, the total number of the first dielectric etch stop layers 462 may be the same as or may differ by one from the total number of the first dielectric matrix layers 464. The first dielectric capping layer 468 may be formed on the topmost first dielectric matrix layer 464.

Figure 17:
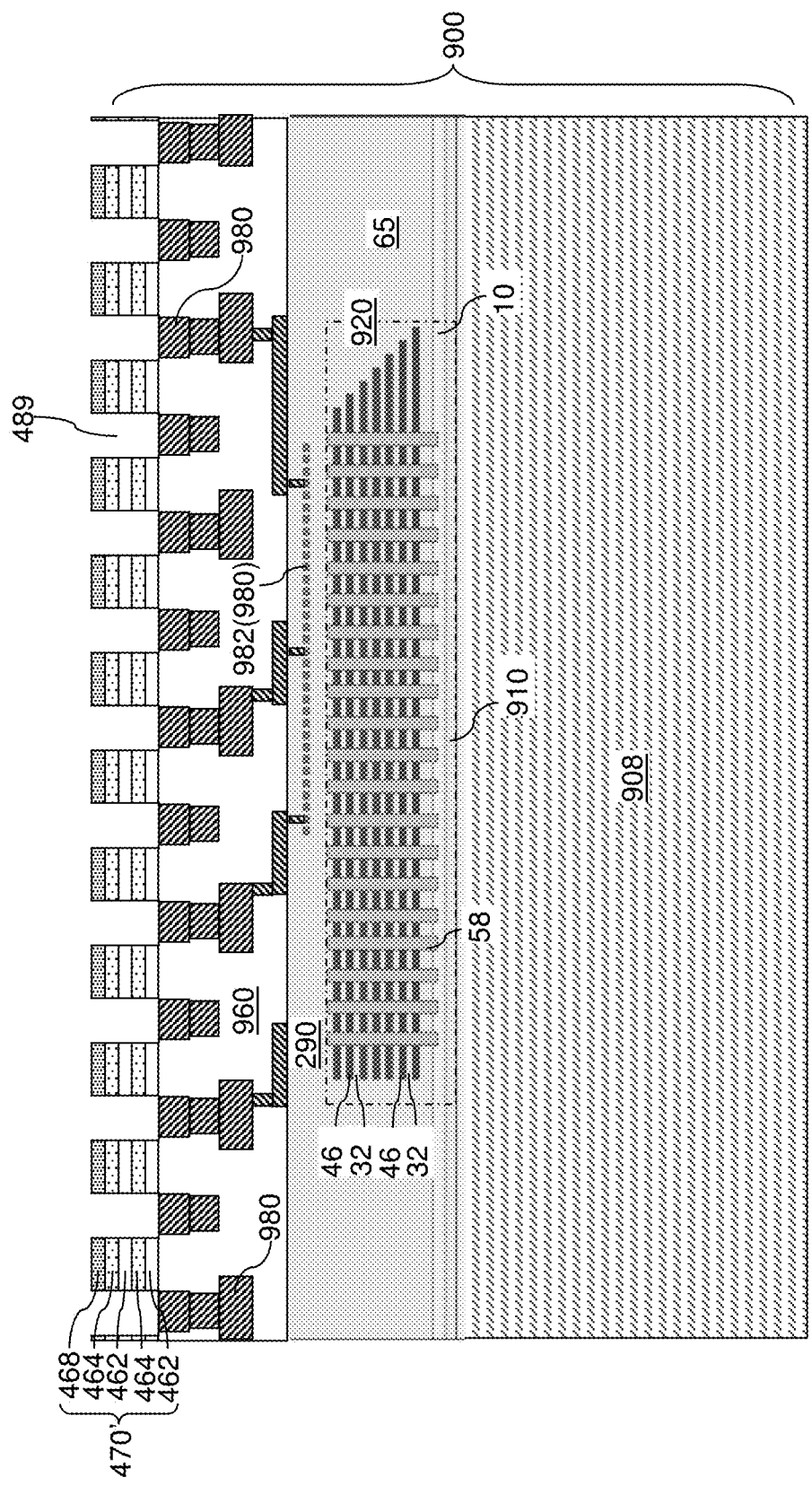
FIG. 17 is a schematic vertical cross-sectional view of the first semiconductor die after formation of first pad airgaps according to the second embodiment of the present disclosure.
Figure 18:
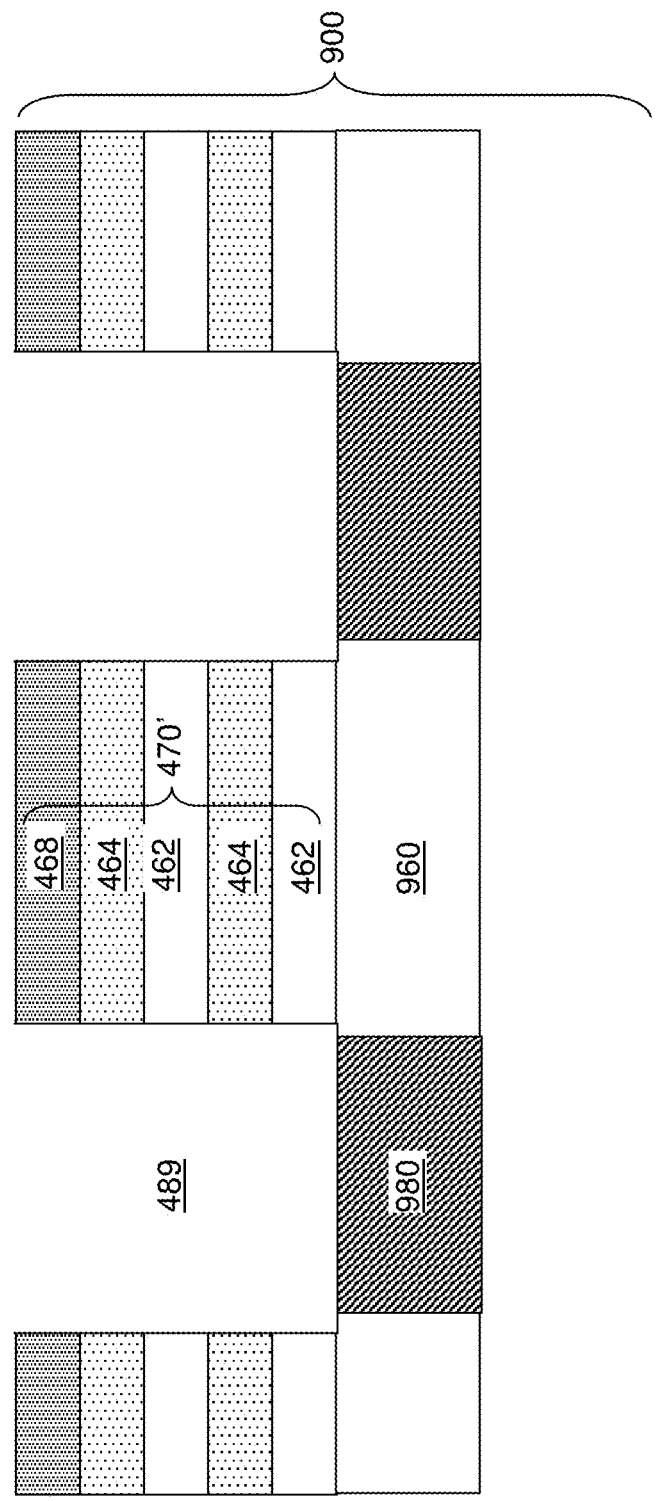
FIG. 18 is a magnified view of a region of the first semiconductor die of FIG. 17.

Referring to FIGS. 17 and 18, a photoresist layer (not shown) can be applied over the layer stack 470', and can be lithographically patterned to form an array of openings. The array of openings may comprise a periodic two-dimensional array of openings. The array of openings may have the same pattern as the pattern of the array of first bonding pads 488 of the first exemplary structure illustrated in FIGS. 8A-8C. An anisotropic etch process can be performed to transfer the pattern of the array of the openings through the layer stack 470'. A two-dimensional array of first pad cavities 489 can be formed through the layer stack 470'. The first pad cavities 489 may have the same pattern as the pattern of the array of first bonding pads 488 of the first semiconductor die 900 illustrated in FIGS. 8A-8C.

Figure 19:
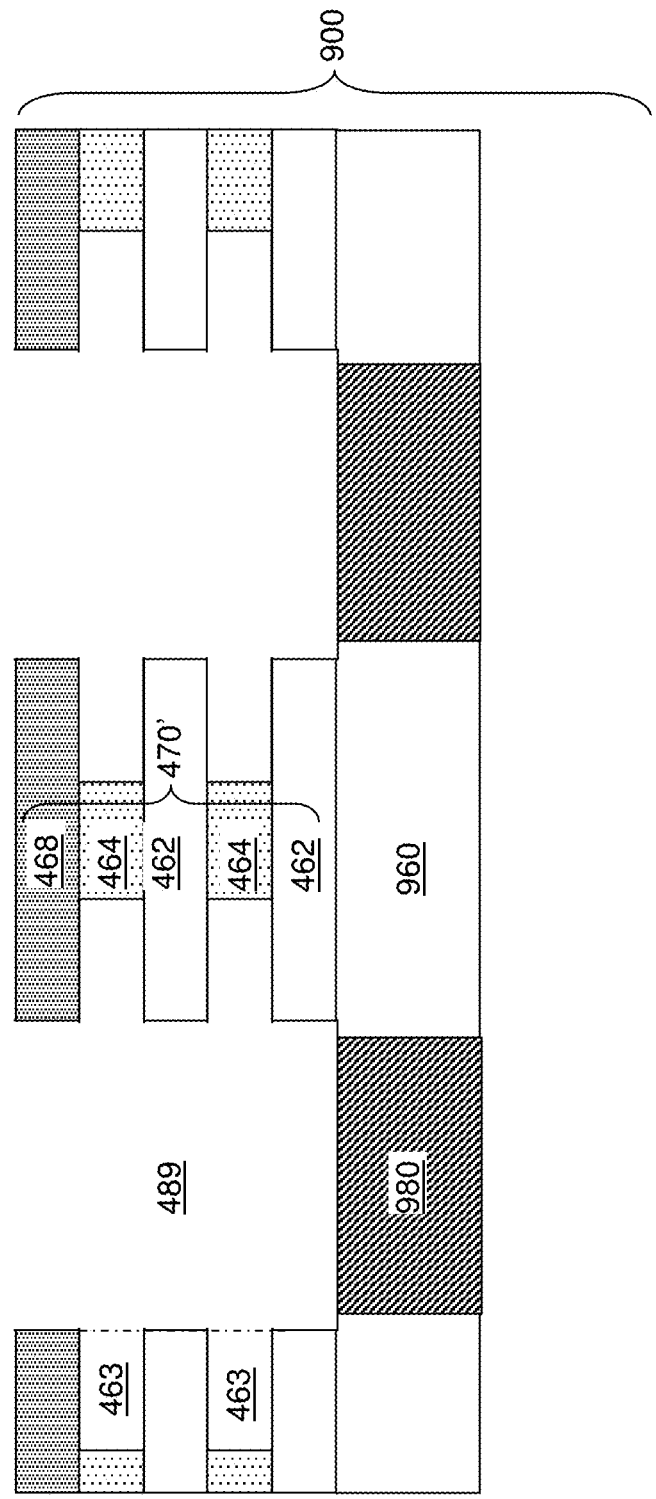
FIG. 19 is a view of a region of the first semiconductor die after formation of lateral recesses according to the second embodiment of the present disclosure.

Referring to FIG. 19, an isotropic etch process can be performed. The isotropic etch process etches the material of the at least one first dielectric matrix layer 464 selective to the material of the first dielectric capping layer 468 and selective to the material of the at least one first dielectric etch stop layer 462, if present. The isotropic etch process may comprise a dry etch process or a wet etch process. For example, if the at least one first dielectric matrix layer 464 comprises borosilicate glass, borophosphosilicate glass, or organosilicate glass and if the first dielectric capping layer 468 and/or the at least one first dielectric etch stop layer 462 comprise silicon nitride, silicon carbide nitride and/or undoped silicate glass, a wet etch process employing dilute hydrofluoric acid can be performed the laterally recess sidewalls of the at least one first dielectric matrix layer 464 without recessing the first dielectric capping layer 468 and/or the at least one first dielectric etch stop layer 462, or with minimal recessing of the first dielectric capping layer 468 and/or the at least one first dielectric etch stop layer 462. Alternatively phosphoric acid may be used to selectively etch silicon nitride containing first dielectric matrix layers 464 relative to silicon oxide first dielectric etch stop layer 462 and first dielectric capping layer 468. The lateral recess 463 distance of the isotropic etch process may be in a range from 5 to 45%, such as from 10% to 40% and/or from 15% to 35%, of the lateral spacing between neighboring pairs of first pad cavities 489 as formed at the processing steps of FIGS. 17 and 18. Generally, lateral recesses 463 can be formed around the first pad cavities 489 by laterally recessing the at least one first dielectric matrix layer 464. The lateral recesses 463 can be formed by isotropically etching the at least one first dielectric matrix layer 464 selective to the first dielectric capping layer 468 and selective to a topmost layer among the first dielectric material layers 960.

Figure 20:
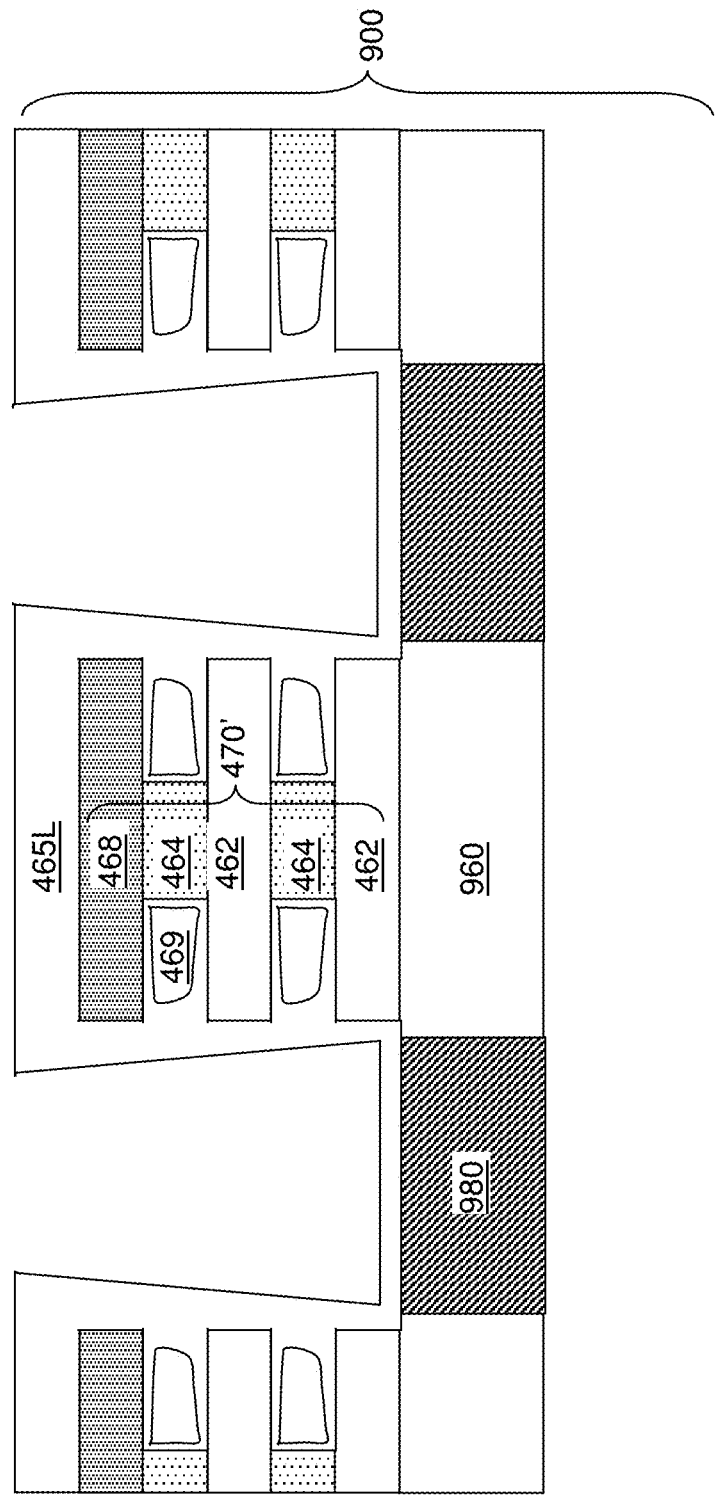
FIG. 20 is a view of a region of the first semiconductor die after anisotropic deposition of a first dielectric fill material layer according to the second embodiment of the present disclosure.

Referring to FIG. 20, a first dielectric fill material layer 465L can be formed by anisotropically depositing a first dielectric fill material. For example, the first dielectric fill material may comprise undoped silicate glass, a doped silicate glass, porous or non-porous organosilicate glass, silicon nitride, silicon oxynitride, silicon oxynitride carbide, or silicon carbide nitride. An anisotropic deposition process such as a plasma-enhanced chemical vapor deposition process (PECVD) may be employed to deposit the first dielectric fill material with directionality. The first dielectric fill material can be anisotropically deposited over the remaining patterned portions of the layer stack 470' such that first encapsulated airgaps 469 are formed within at least one, and/or each, of the lateral recesses 463 located at each level of the at least one first dielectric matrix layer 464. The thickness of horizontally-extending portions of the first dielectric fill material layer 465L overlying a horizontal surfaces of the first dielectric capping layer 468 may be in a range from 10 nm to 150 nm, such as from 20 nm to 50 nm. The lateral thickness of vertically-extending portions of the first dielectric fill material layer 465L at the peripheral portions of each first pad airgap 489 decreases with a vertical distance from the horizontal plane including the topmost surface of the first dielectric fill material layer 465L toward the first substrate 908, and may be in a range from 1 nm to 100 nm, such as from 2 nm to 30 nm, although lesser and greater lateral thicknesses may also be employed.

Generally, the first dielectric fill material layer 465L can be formed by anisotropic deposition of the first dielectric fill material. The first dielectric fill material can be deposited into peripheral regions of the lateral recesses 463 and the first pad cavities 489. The first encapsulated airgaps 469 are formed within unfilled volumes of the lateral recesses 463. Thus, the first encapsulated airgaps 469 can be encapsulated by portions of the first dielectric fill material that are located within the lateral recesses. Each of the at least one first encapsulated airgap 469 may be formed below a horizontal plane including top surfaces of the first dielectric capping layer 468.

In one embodiment, at least one first encapsulated airgap 469 can be formed around each first pad cavity 489. In one embodiment, a vertical stack of at least two first encapsulated airgaps 469 can be formed around each first pad airgap 489. In one embodiment, each first encapsulated airgap 469 may be topologically homeomorphic to a torus, i.e., may be continuously deformed into a shape of a torus without creating a new hole and without destroying any pre-existing hole. In one embodiment, a two-dimensional array of discrete first encapsulated airgaps 469 can be formed, which can have the same periodicity as the array of first pad airgaps 489 as formed at the processing steps of FIGS. 17 and 18. In one embodiment, the two-dimensional array of discrete first encapsulated airgaps 469 may have a first periodicity along a first horizontal direction and may have a second periodicity along a second horizontal direction.

In one embodiment, the at least one first encapsulated airgap 469 may comprise a plurality of first encapsulated airgaps 469, which may be a two-dimensional periodic array of first encapsulated airgaps 469. In one embodiment, the at least one first encapsulated airgap 469 may comprise a two-dimensional periodic array of toroidal encapsulated airgaps 469. As used herein, an object is "toroidal" if the object has a general shape of a toroid with, or without a continuous rotational symmetry around an axis passing through a geometrical center of the object. In case the first pad airgaps 489 have rectangular horizontal cross-sectional shapes, the volume of each first encapsulated airgap 469 does not have a continuous rotational symmetry, but may have a mirror symmetry and a two-fold rotational symmetry. In one embodiment, each of the first encapsulated airgaps 469 may have a vertical cross-sectional profile in which a vertical dimension (i.e., the distance between a top surface and a bottom surface) increases with a lateral distance from a most proximal one among the first pad cavities 489. Thus, the first encapsulated airgaps 469 of the second embodiment may be referred to as horizontal (or lateral or horizontally extending) airgaps, while the first encapsulated airgaps 479 of the first embodiment may be referred to as vertical (or vertically extending) airgaps.

In case a plurality of first dielectric matrix layers 464 is present, the first encapsulated airgaps 469 may be formed at multiple levels. In this case, multiple subsets of first encapsulated airgaps 469 may be formed at a level of a respective one of the plurality of first dielectric matrix layers 464. In one embodiment, the at least one first encapsulated airgap 469 in the first semiconductor die 900 may comprises a plurality of first encapsulated airgaps 469 that includes a first subset and a second subset. The first subset of the plurality of first encapsulated airgaps 469 may be located at a first distance from a horizontal plane including a topmost surface of the first dielectric capping layer 468. The second subset of the plurality of first encapsulated airgaps 469 may be located at a second distance from the horizontal plane including the topmost surface of the first dielectric capping layer 468. The second distance may be less than the first distance by more than a vertical extent of the first subset of the plurality of first encapsulated airgaps 469.

Figure 21:
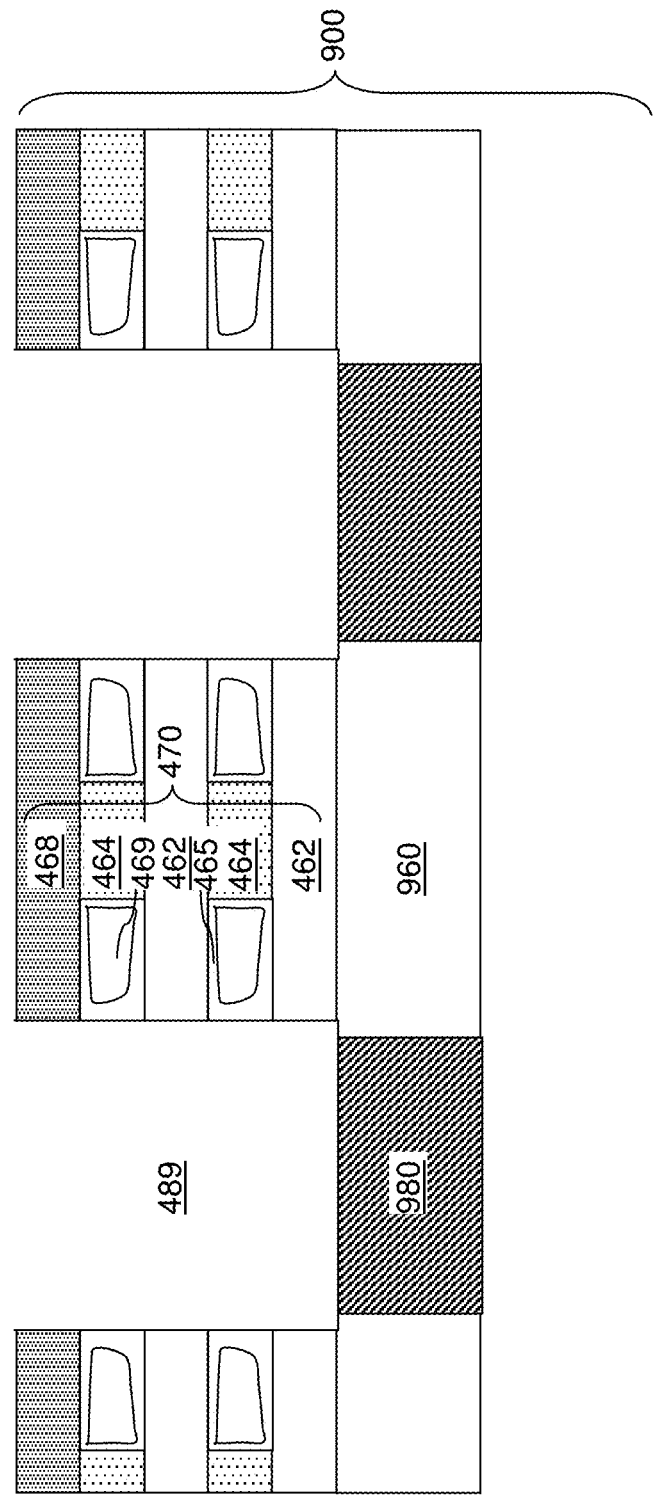
FIG. 21 is a view of a region of the first semiconductor die after anisotropically etching the first dielectric fill material layer according to the second embodiment of the present disclosure.

Referring to FIG. 21, an anisotropic etch process can be performed to remove the first dielectric fill material from above the horizontal plane including the top surface of the first dielectric capping layer 468 and from inside the volumes of the first pad cavities 489. Removal of the first dielectric fill material may be selective to the material of the first dielectric capping layer 468 and the material of the topmost layer of the first dielectric material layers 960 and the first metal interconnect structures 980. Each remaining portion of the first dielectric fill material that remains in a respective lateral recess 463 constitutes a first dielectric fill material portion 465. In one embodiment, a vertical stack of dielectric fill material portions 465 may be formed around each first pad airgap 489. In one embodiment, a two-dimensional periodic array of first dielectric fill material portions 465 embedding a two-dimensional array of first encapsulated airgaps 469 may be formed.

The combination of all dielectric material portions and the first encapsulated airgaps 469 located above the horizontal plane including the topmost surface of the first dielectric material layers 960 constitute a first pad-level dielectric layer 470. The first pad-level dielectric layer 470 comprises at least one first dielectric etch stop layer 462, if present, at least one first dielectric matrix layer 464, first dielectric fill material portions 465, first encapsulated airgaps 469 embedded within the first dielectric fill material portions 465, and the first dielectric capping layer 468. The first dielectric capping layer 468 overlies, and contacts, the first dielectric fill material.

Figure 22:
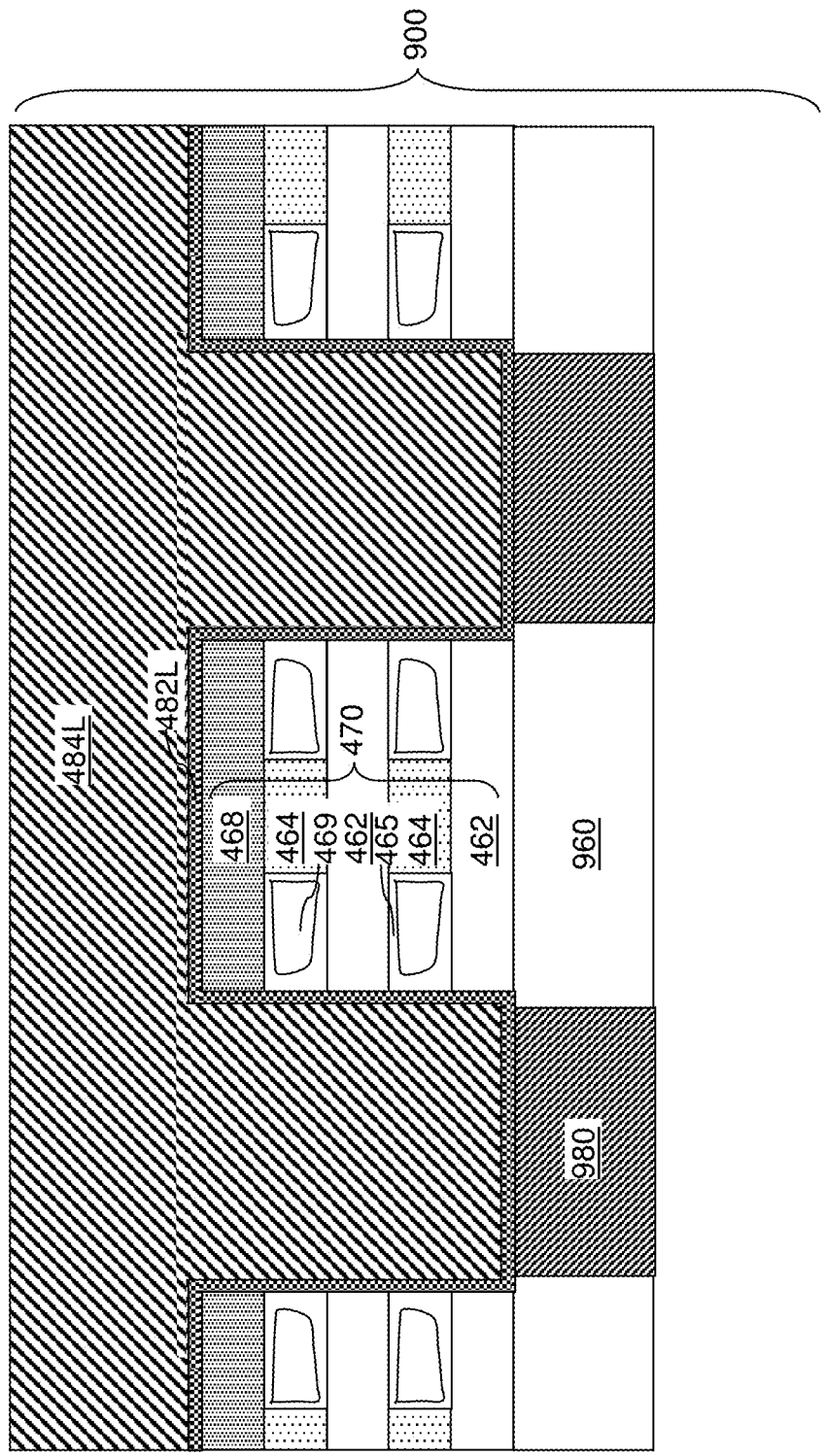
FIG. 22 is a view of a region of the first semiconductor die after formation of a first metallic adhesion liner layer and a first metal layer according to the second embodiment of the present disclosure.

Referring to FIG. 22, an optional first metallic adhesion liner layer 482L and a first metal layer 484L can be formed in the first pad airgaps 489 and over the first dielectric capping layer 468. The optional first metallic adhesion liner layer 482L includes a metallic material that can enhance adhesion of the first metal layer 484L to the physically exposed surfaces of the first metal interconnect structures 980 and the first dielectric material layers 960. For example, the first metallic adhesion liner layer 482L may include titanium nitride, tantalum nitride, tungsten nitride, or a combination thereof. The thickness of the first metallic adhesion liner layer 482L may be in a range from 1 nm to 10 nm, such as from 2 nm to 5 nm, although lesser and greater thicknesses may also be employed. The first metal layer 484L includes a metal that can be employed as a main material for first bonding pads. The first metal layer 484L may include copper or a copper-based alloy material. The thickness of the first metal layer 484L is selected such that the entire volume of all first pad airgaps 489 can be filled with a combination of the first metallic adhesion liner layer 482L and the first metal layer 484L, and can be determined based on the total thickness of the first pad-level dielectric layer 470. In one embodiment, the thickness of the first metal layer 484L may be in a range from 30 nm to 1,000 nm, such as from 50 nm to 500 nm, although lesser and greater thicknesses may also be employed.

Figure 23:
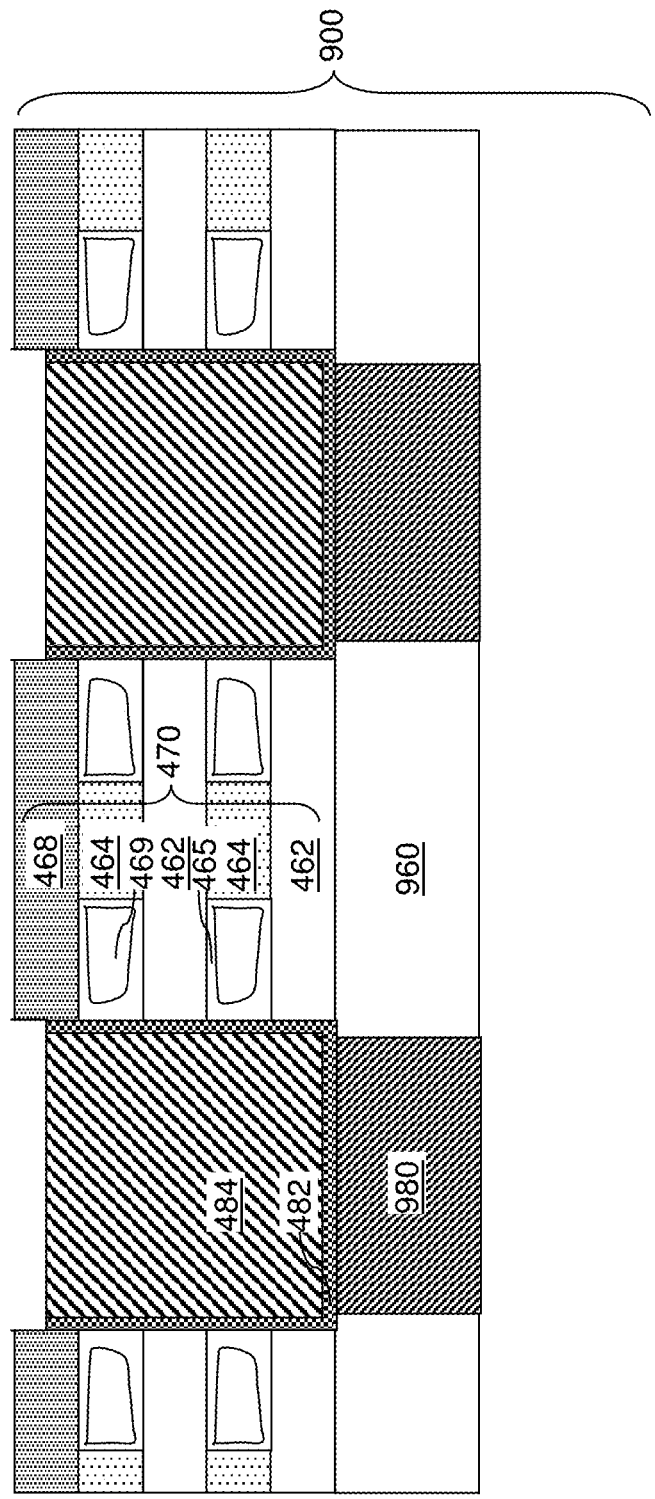
FIG. 23 is a view of a region of the first semiconductor die after formation of stacks of a first metallic adhesion liner a first metal plate according to the second embodiment of the present disclosure.

Referring to FIG. 23, a chemical mechanical polishing (CMP) process can be performed to remove portions of the first metallic adhesion liner layer 482L and the first metal layer 484L that overlie a horizontal plane including a top surface of the first dielectric capping layer 468. Further, the materials of the first metallic adhesion liner layer 482L and the first metal layer 484L can be subsequently vertically recessed by performing a recess etch process so that the recessed surfaces of the remaining portions of the first metallic adhesion liner layer 482L and the first metal layer 484L are formed below the horizontal plane including the top surface of the first dielectric capping layer 468. The vertical recess distance, i.e., the vertical distance between the horizontal plane including the top surface of the first dielectric capping layer 468 and the recessed surfaces of the first metallic adhesion liner layer 482L and the first metal layer 484L may be in a range from 3 nm to 60 nm, such as from 6 nm to 30 nm, although lesser and greater vertical recess distances may also be employed. Each patterned portion of the first metallic adhesion liner layer 482L constitutes a first metallic adhesion liner 482. Each patterned portion of the first metal layer 484L constitutes a first metal plate 484. Each first metallic adhesion liner 482 can contact a proximal planar surface (i.e., a bottom surface) of a first metal plate 484. The proximal planar surface is more proximal to the first substrate 908 than the sidewall surfaces of the first metal plate 484 are from the first substrate 908.

Figure 24:
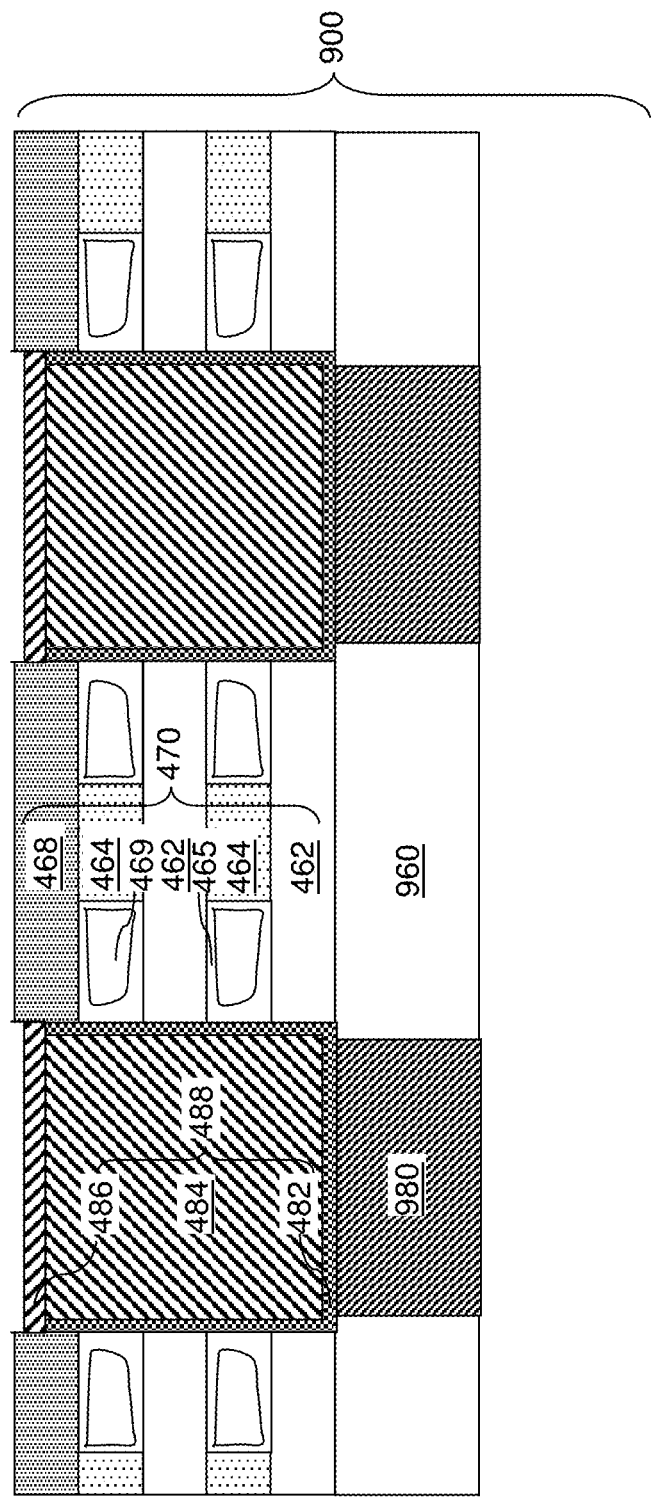
FIG. 24 is a schematic vertical cross-sectional view of the first semiconductor die after formation of first metallic capping layers according to the second embodiment of the present disclosure.

Referring to FIG. 24, first metallic capping layers 486 may be optionally formed by on the physically exposed surfaces of the first metal plates 484 and the first metallic adhesion liners 483. For example, a selective deposition process can be performed to deposit a first metallic capping material on physically exposed surfaces of the first metal plates 484 and the optional first metallic adhesion liners 483 while suppressing deposition of the first metallic capping material from dielectric surfaces such as the physically exposed surfaces of the first dielectric capping layer 468. Each of the first metallic capping layers 486 can be deposited on a top surface of a respective one of the first metal plates 484. The selective deposition process may comprise an electroplating process, a selective chemical vapor deposition process, or a selective atomic layer deposition process. In case selective chemical vapor deposition process or a selective atomic layer deposition process is employed, an etchant that etches spurious nucleation of the first metallic capping material on dielectric surfaces can be flowed into a process chamber concurrently, or alternately, with flow of a metal-containing precursor gas. The first metallic capping material may include a material that increases electromigration resistance of the material of the first metal plates 484. For example, the first metallic capping material may comprise, and/or may consist essentially of, Co, CoW, Pd, Ti, Ru, or a refractory metal that enhances electromigration resistance. The thickness of each first metallic capping layer 486 may be in a range from 1 nm to 10 nm, such as from 2 nm to 5 nm, although lesser and greater thicknesses may also be employed.

Each contiguous combination of an optional first metallic adhesion liner 482, a first metal plate 484, and an optional first metallic capping layer 486 constitutes a first bonding pad 488. The first metallic adhesion liners 482 are optional elements, and thus, may, or may not, be present. The first metallic capping layers 486 are also optional elements, and thus, may, or may not, be present. In one embodiment, each of the first bonding pads 488 comprises a first metal plate 484 and a first metallic capping layer 486 contacting a distal planar surface (i.e., a top surface) of the first metal plate 484. The distal planar surface is more distal from the first substrate 908 than the sidewall surfaces of the first metal plate 484 are from the first substrate 908. In one embodiment, each of the first metallic capping layers 486 comprises a horizontal surface (which is a topmost surface) that is subsequently employed to directly contact, and to provide metal-to-metal bonding with, a horizontal surface of a respective one of second bonding pads to be provided in a second semiconductor die.

The first bonding pads 488 are formed in the first pad cavities 489, and are laterally surrounded by the first pad-level dielectric layer 470. The first pad-level dielectric layer 470 comprises at least one first encapsulated airgap 469 (such as a plurality of first encapsulated airgaps 469) located between neighboring pairs of first bonding pads 488 and encapsulated by a first dielectric fill material of the first pad-level dielectric layer 470, which is the first dielectric fill material of the first dielectric fill material portions 465 within the first pad-level dielectric layer 470. In one embodiment, each of the first bonding pads 488 comprises a first metal plate 484 and a first metallic capping layer 486 contacting a distal planar surface of the first metal plate 484. The distal planar surface is more distal from the first substrate 908 than the sidewall surfaces of the first metal plate 484 are from the first substrate 908. In one embodiment, each of the first metallic capping layers 486 comprises a horizontal surface that directly contacts and provides metal-to-metal bonding with a horizontal surface of a respective one of second bonding pads in a second semiconductor die in a subsequent processing step.

Figure 25:
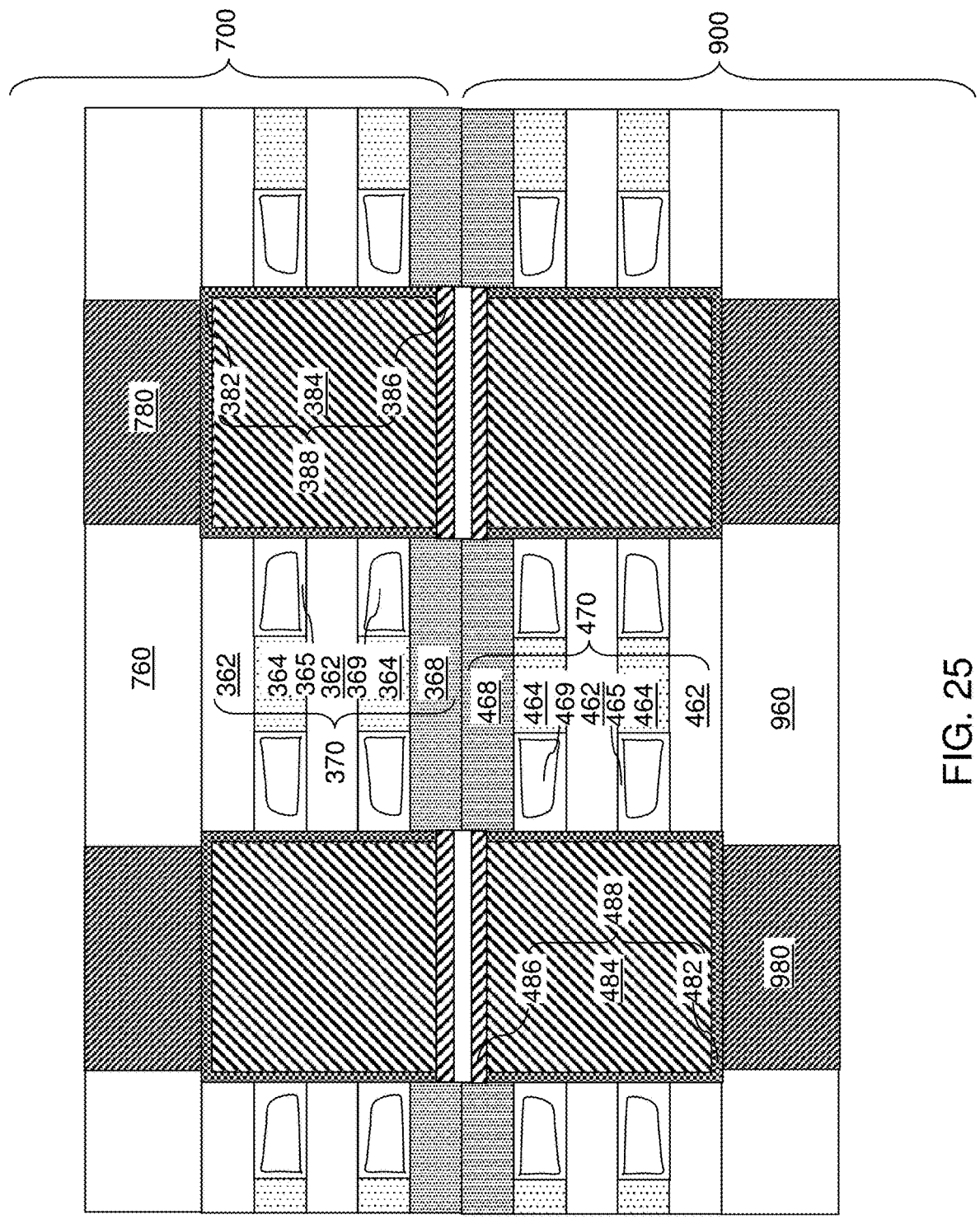
FIG. 25 is a schematic vertical cross-sectional view of a region of a second exemplary structure including the first semiconductor die and the second semiconductor die after disposing the first semiconductor die on the second semiconductor die according to the second embodiment of the present disclosure.

Referring to FIG. 25, a second semiconductor die 700 is provided according to an embodiment of the present disclosure. The second semiconductor die 700 illustrated in FIG. 25 can be derived from the second semiconductor die 700 illustrated in FIG. 9 by forming a combination of a second pad-level dielectric layer 370 and second bonding pads 388 employing the processing steps of FIGS. 16-24 with any needed changes instead of employing the processing steps illustrated in the processing steps of FIGS. 2-8C. In other words, the processing steps employed to form the first semiconductor die 900 illustrated in FIG. 24 are employed instead of employing the processing steps employed to form the second semiconductor die 700 illustrated in FIG. 9.

Second bonding pads 388 and a second pad-level dielectric layer 370 can be formed employing the same methods described above that are employed to form the first bonding pads 488 and the first pad-level dielectric layer 470 illustrated in FIG. 24. The second bonding pads 388 can be formed in a mirror image pattern of the pattern of the first bonding pads 488. Each of the second bonding pads 388 may comprise an optional second metallic adhesion liner 382, a second metal plate 384, and an optional second metallic capping layer 386. The second pad-level dielectric layer 370 may comprise at least one second dielectric etch stop layer 362 optionally, and may comprise at least one second dielectric matrix layer 364, at least one second dielectric fill material portion 365 (such as a two-dimensional array of second dielectric fill material portions 365), and at least one second encapsulated airgap 369 (such as a two-dimensional array of toroidal second encapsulated airgaps 369), and a second dielectric capping layer 368.

Generally, the second metallic adhesion liners 382 may have any material composition that may be employed for the first metallic adhesion liners 483, and may have the same thickness range as the first metallic adhesion liners 483. The second metal plates 384 may have any material composition that may be employed for the first metal plates 484, and may have the same thickness range as the first metal plates 484. The second metallic capping layers 386 may have any material composition that may be employed for the first metallic capping layers 485, and may have the same thickness range as the first metallic capping layers 485. The at least one second dielectric etch stop layer 362 may have any material composition that may be employed for the at least one first dielectric etch stop layer 462, and may have the same thickness range as the at least one first dielectric etch stop layer 462. The at least one second dielectric matrix layer 364 may have any material composition that may be employed for the at least one first dielectric matrix layer 464, and may have the same thickness range as the at least one first dielectric matrix layer 464. The second dielectric fill material of the at least one second dielectric fill material portions 365 may include any material that may be employed for the first dielectric fill material. In one embodiment, the first dielectric fill material and the second dielectric fill material are selected such that high adhesion strength may be obtained between the first dielectric material and the second dielectric material after a subsequent bonding process. The at least one second encapsulated airgap 369 may have the same geometry as the at least one first encapsulated airgap 469.

The second semiconductor die 700 comprises the second substrate 708, the second semiconductor devices 720, and second bonding pads 388 that are electrically connected to a respective node of the second semiconductor devices 720 and laterally surrounded by the second pad-level dielectric layer 370. The second pad-level dielectric layer 370 may comprise at least one second encapsulated airgap 369 located between neighboring pairs of second bonding pads 388 and encapsulated by the second dielectric fill material of the second pad-level dielectric layer 370, which is the second dielectric fill material of the second dielectric fill material portions 365.

Referring to FIG. 25, the first semiconductor die 900 and the second semiconductor die 700 are oriented such that the first bonding pads 488 face the second bonding pads 388, and the first pad-level dielectric layer 470 faces the second pad-level dielectric layer 370. The second semiconductor die 700 and the first semiconductor die 900 are brought into contact such that a horizontal surface of the first dielectric capping layer 468 contacts a horizontal surface of the second dielectric capping layer 368, and each of the second bonding pads 388 faces, and has an areal overlap in a plan view with, a respective one of the first bonding pads 488. In one embodiment, the pattern of the second bonding pads 388 may be a mirror image of the pattern of the first bonding pads 488 with optional differences in the size of bonding pads between the first semiconductor die 900 and the second semiconductor die 700. In one embodiment, the first bonding pads 488 and the corresponding second bonding pads 388 may have the same size (i.e., lateral width). In another embodiment, the first bonding pads 488 and the corresponding second bonding pads 388 may have different sizes. In one embodiment, areal overlap between each facing pair of a first bonding pad 488 and a second bonding pad 388 may be at least 80%, and/or at least 90%, such as 90 to 100%, of the area of the smaller one of the first bonding pad 488 and the second bonding pad 388. Gaps are present between each mating pair of a first bonding pad 488 and a second bonding pad 388.

Figure 26:
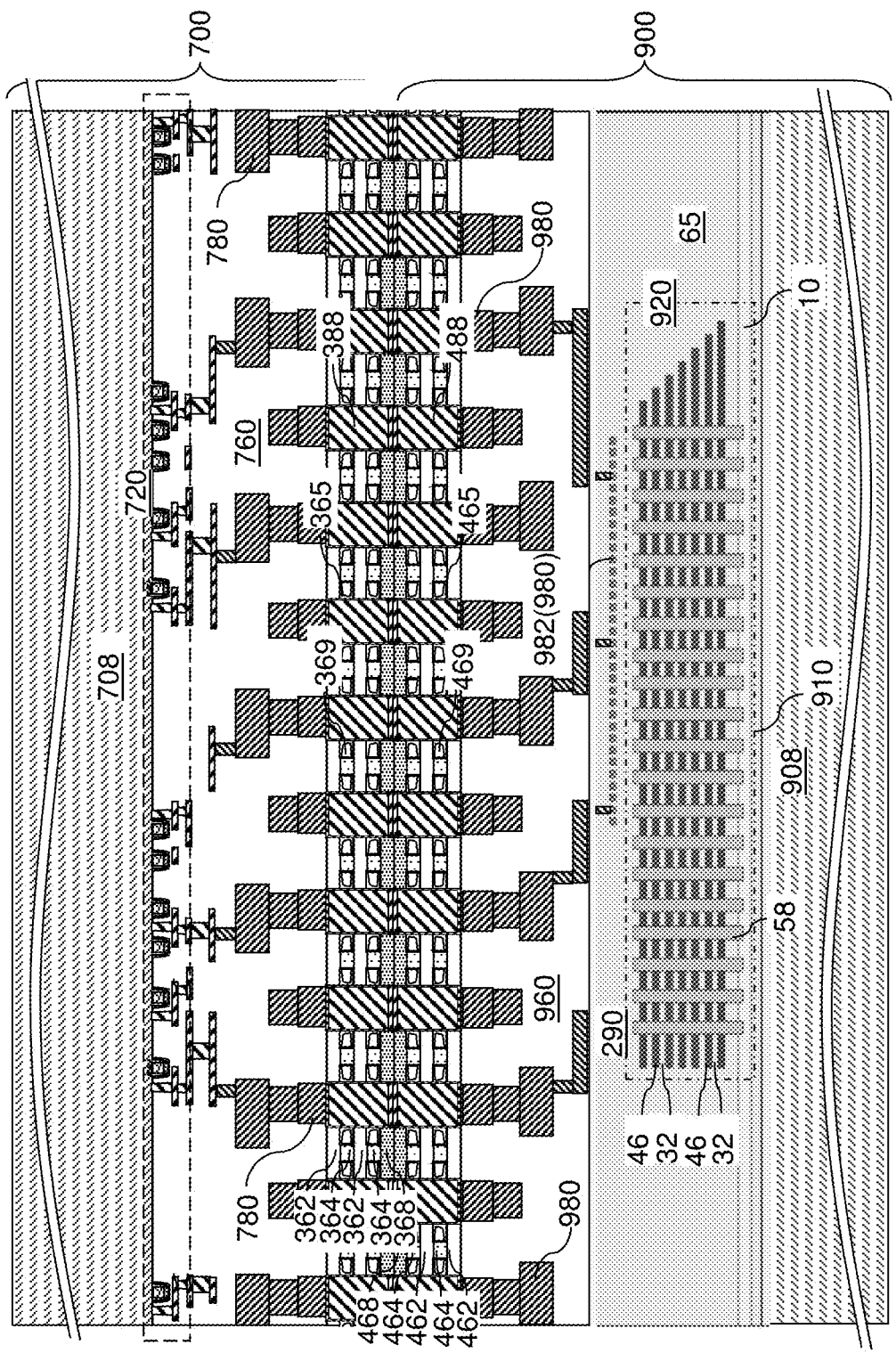
FIG. 26 is a schematic vertical cross-sectional view of the second exemplary structure after bonding the first semiconductor die to the second semiconductor die according to the second embodiment of the present disclosure.
Figure 27:
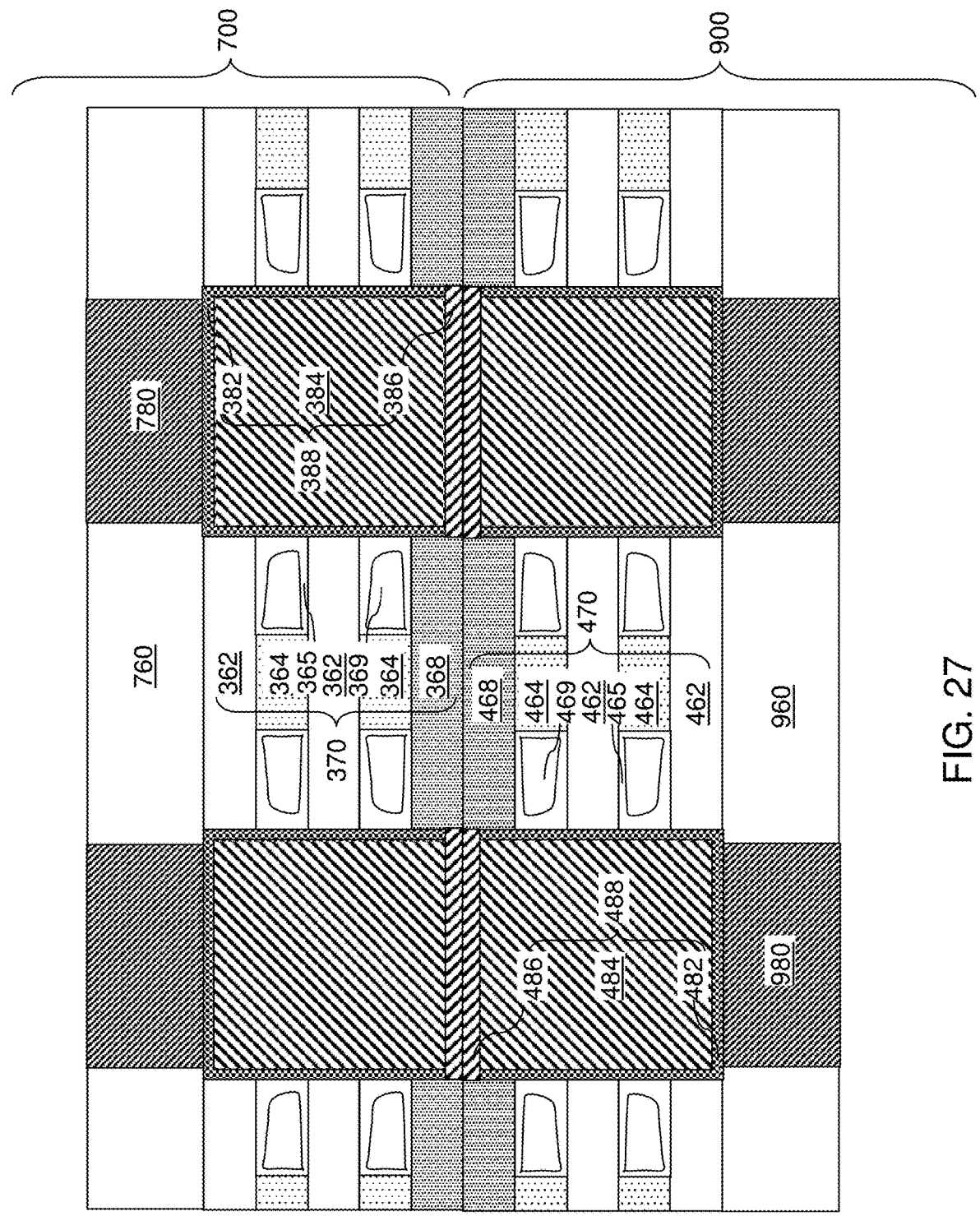
FIG. 27 is a magnified view of a region of the second exemplary structure of FIG. 26.

Referring to FIGS. 26 and 27, the second bonding pads 388 may be bonded to the first bonding pads 488 by performing an anneal process that induces metal-to-metal bonding between the second bonding pads 388 and the first bonding pads 488. The anneal process may also optionally induce dielectric-to-dielectric bonding between the first dielectric fill material layer 474 and the second dielectric fill material layer 374. The anneal temperature may be selected based on the composition of the second bonding pads 388 and the first bonding pads 488. For example, if the second bonding pads 388 and the first bonding pads 488 include metal plates (384, 484) that consist essentially of copper, the anneal temperature may be in a range from 150 degrees Celsius to 400 degrees Celsius, such as from 300 degrees Celsius to 350 degrees Celsius. The first bonding pads 488 and the second bonding pads 388 thermally expand in volume such that surfaces of the first bonding pads 488 contact surfaces of the second bonding pads 388 at, or near, the horizontal plane including the interface between the first dielectric capping layer 468 and the second dielectric capping layer 368. The bonding interfaces between the first bonding pads 488 and the second bonding pads 388 are formed at, or in proximity to, the horizontal plane including the interface between the first dielectric capping layer 468 and the second dielectric capping layer 368. In one embodiment, the first dielectric capping layer 468 may be bonded to the second dielectric capping layer 368 during the anneal process.

In one embodiment, each of the first bonding pads 488 comprises a first metal plate 484 and a first metallic capping layer 486 contacting a distal planar surface of the first metal plate 484. The distal planar surface of the first metal plate 484 can be more distal from the first substrate 908 than the sidewall surfaces of the first metal plate 484 are from the first substrate 908. In one embodiment, each of the first metallic capping layers 486 comprises a horizontal surface that directly contacts and provides metal-to-metal bonding with a horizontal surface of a respective one of the second bonding pads 388. The horizontal surface of the respective one of the second bonding pads 388 may be a horizontal surface of a second metallic capping layer 386, or a horizontal surface of a second metal plate 384 in case a second metallic capping layer is not employed.

In one embodiment, each of the second bonding pads 388 comprises a second metal plate 384 and a second metallic capping layer 386 contacting a distal planar surface of the second metal plate 384. The distal planar surface of the second metal plate 384 can be more distal from the second substrate 708 than the sidewall surfaces of the second metal plate 384 are from the second substrate 708. In one embodiment, each of the second metallic capping layers 386 comprises a horizontal surface that directly contacts and provides metal-to-metal bonding with a horizontal surface of a respective one of the first bonding pads 488. The horizontal surface of the respective one of the first bonding pads 488 may be a horizontal surface of a first metallic capping layer 486, or a horizontal surface of a first metal plate 484 in case a first metallic capping layer is not employed.

Figure 28:
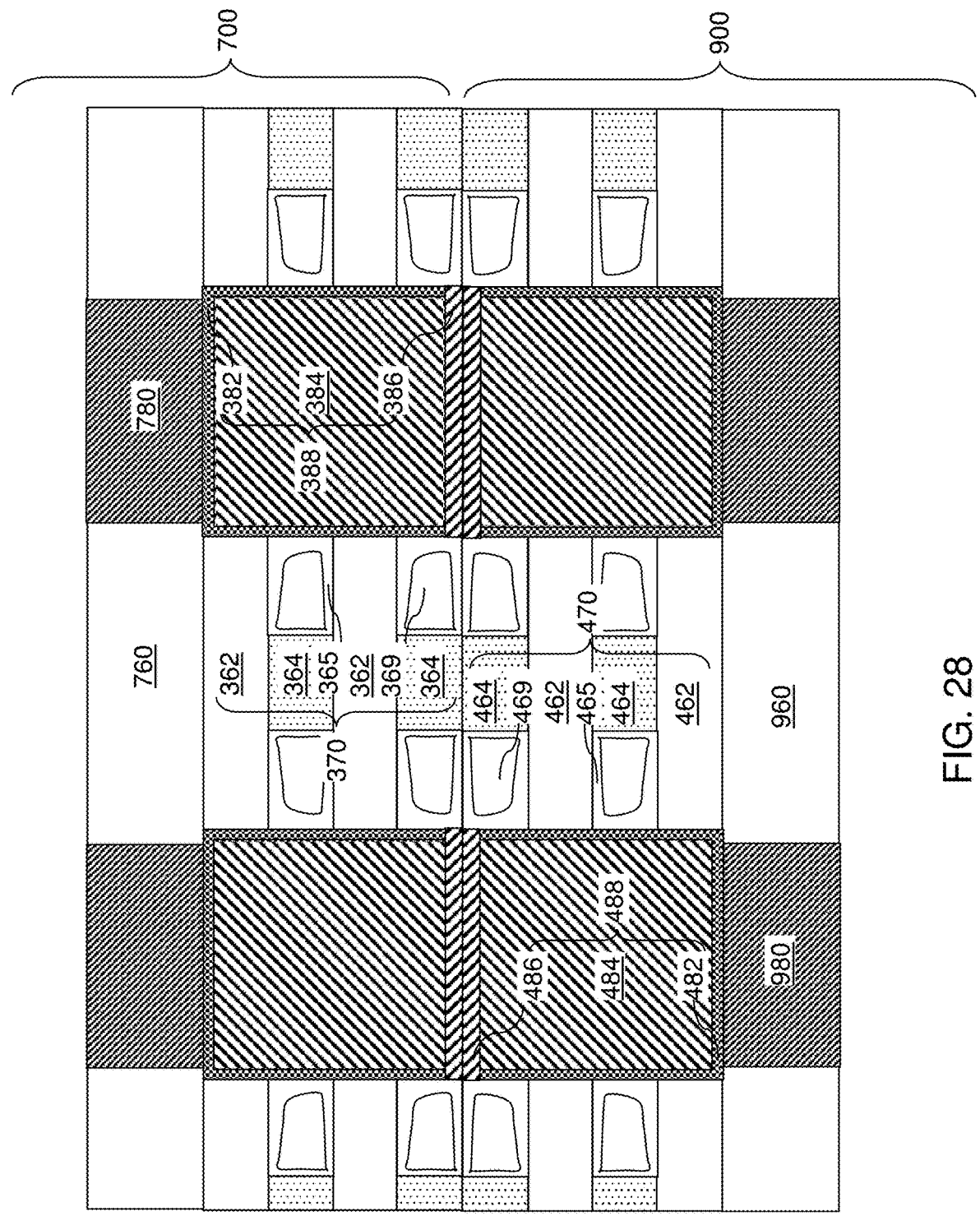
FIG. 28 is a schematic vertical cross-sectional view of a region of a first alternative configuration of the second exemplary structure after bonding the first semiconductor die to the second semiconductor die according to the second embodiment of the present disclosure.

Referring to FIG. 28, a first alternative configuration of the second exemplary structure according to the second embodiment of the present disclosure is illustrated. The first alternative configuration of the second exemplary structure can be derived from the second exemplary structure illustrated in FIG. 28 by omitting or removing the first dielectric capping layer 468 and/or by omitting or removing the second dielectric capping layer 368 prior to bonding the second semiconductor die 700 to the first semiconductor die 900.

If the first dielectric capping layer 468 is removed from the first semiconductor die 900 prior to bonding, the vertical recess distance that recesses the top surfaces of the first metallic adhesion liners 482 and the first metal plate 484 and the thickness of the first metallic capping layer 486 (if present) can be selected such that the top surfaces of the first bonding pads 488 are vertically recessed from the topmost surface of the first pad-level dielectric layer 470 (after removal of the first dielectric capping layer 468) by a vertical thermal expansion distance of the first bonding pads 488 during the anneal process that bonds the first bonding pads 488 to the second bonding pads 388. In this case, a subset of the first dielectric fill material portions 465 of the first semiconductor die 900 contacts, and may be bonded to, a dielectric material in the second semiconductor die 700, which may be the dielectric material of the second dielectric fill material portions 365 or the dielectric material of the second dielectric capping layer 368.

If the second dielectric capping layer 368 is removed from the second semiconductor die 700 prior to bonding, the vertical recess distance that recesses the top surfaces of the second metallic adhesion liners 382 and the second metal plate 384 and the thickness of the second metallic capping layer 386 (if present) can be selected such that the top surfaces of the second bonding pads 388 are vertically recessed from the topmost surface of the second pad-level dielectric layer 370 (after removal of the second dielectric capping layer 368) by a vertical thermal expansion distance of the second bonding pads 388 during the anneal process that bonds the first bonding pads 488 to the second bonding pads 388. In this case, a subset of the second dielectric fill material portions 365 of the second semiconductor die 700 contacts, and may be bonded to, a dielectric material in the first semiconductor die 900, which may be the dielectric material of the first dielectric fill material portions 465 or the dielectric material of the first dielectric capping layer 468.

In one embodiment, bonding portions of the first dielectric fill material to a dielectric material in the second semiconductor die 700 (such as the second dielectric fill material of the second dielectric fill material portions 365 or the dielectric material of the second dielectric capping layer 368) may occur prior to, concurrently with, or after, bonding the first bonding pads 488 to the second bonding pads 388. In one embodiment, bonding portions of the second dielectric fill material to a dielectric material in the first semiconductor die 900 (such as the first dielectric fill material of the first dielectric fill material portions 465 or the dielectric material of the first dielectric capping layer 468) may occur prior to, concurrently with, or after, bonding the first bonding pads 488 to the second bonding pads 388.

Figure 29:
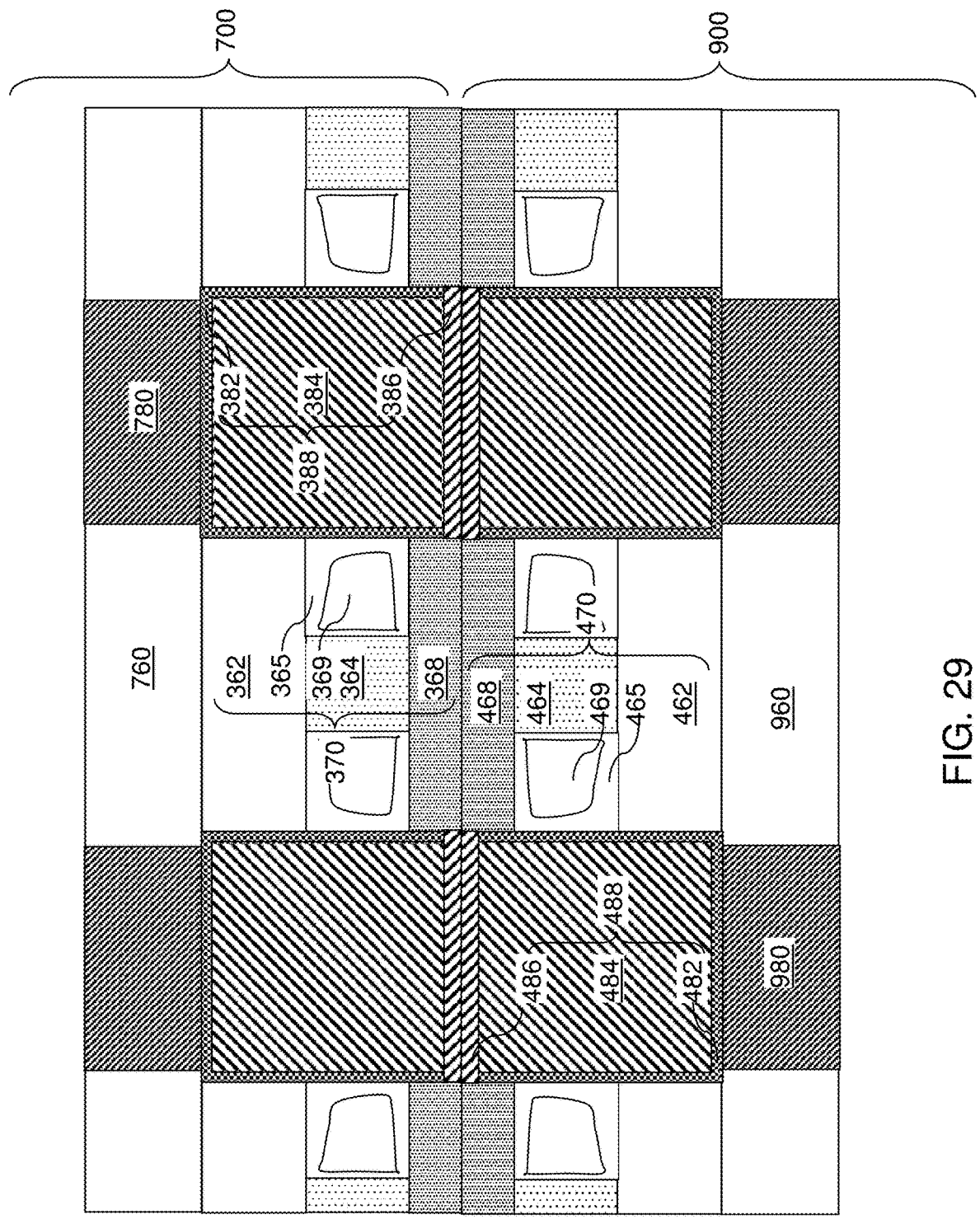
FIG. 29 is a schematic vertical cross-sectional view of a region of a second alternative configuration of the second exemplary structure after bonding the first semiconductor die to the second semiconductor die according to the second embodiment of the present disclosure.

Referring to FIG. 29, a second alternative configuration of the second exemplary structure according to the second embodiment of the present disclosure is illustrated. The second alternative configuration of the second exemplary structure may be derived from the second exemplary structure illustrated in FIG. 27 by including only one first dielectric matrix layer 464 (and thus, only one level of the first dielectric fill material portions 465) and/or by including only one second dielectric matrix layer 364 (and thus, only one level of the second dielectric fill material portions 365). The total number of the at least one first dielectric etch stop layer 462 and/or the total number of the at least one second dielectric etch stop layer 362 may be changed as needed.

Figure 30:
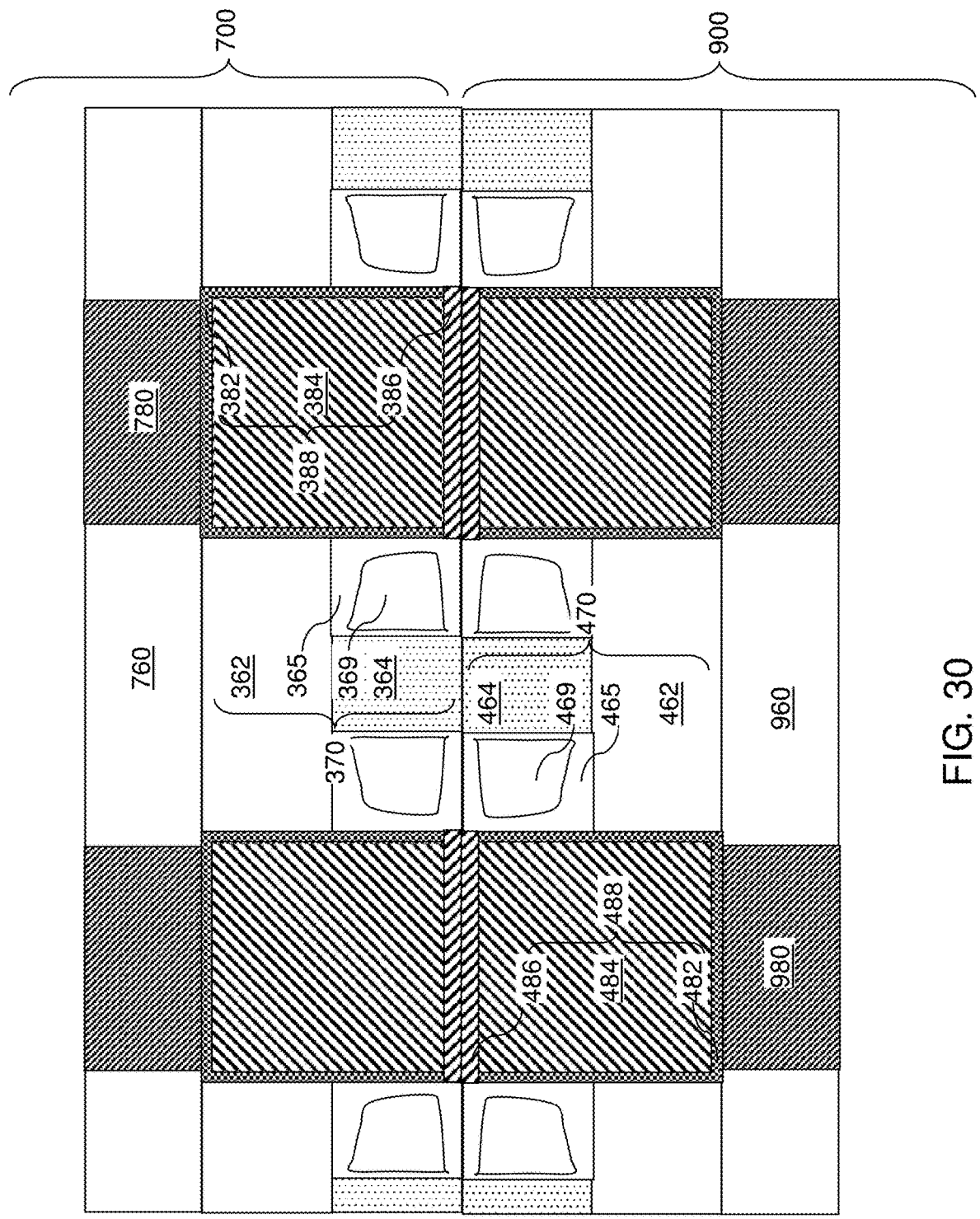
FIG. 30 is a schematic vertical cross-sectional view of a region of a third alternative configuration of the second exemplary structure after bonding the first semiconductor die to the second semiconductor die according to the second embodiment of the present disclosure.

Referring to FIG. 30, a third alternative configuration of the second exemplary structure according to the second embodiment of the present disclosure is illustrated. The third alternative configuration of the second exemplary structure may be derived from the first alternative configuration of the second exemplary structure illustrated in FIG. 28 by including only one first dielectric matrix layer 464 (and thus, only one level of the first dielectric fill material portions 465) and/or by including only one second dielectric matrix layer 364 (and thus, only one level of the second dielectric fill material portions 365). The total number of the at least one first dielectric etch stop layer 462 and/or the total number of the at least one second dielectric etch stop layer 362 may be changed as needed.

Referring to all drawings and according to various embodiments of the present disclosure, a bonded assembly is provided, which comprises: a first semiconductor die 900 comprising a first substrate 908, first semiconductor devices 920, and first bonding pads 488 that are electrically connected to a respective node of the first semiconductor devices 920 and laterally surrounded by a first pad-level dielectric layer 470, wherein the first pad-level dielectric layer 470 comprises at least one first encapsulated airgap (479 or 469) located between neighboring pairs of first bonding pads 488 and encapsulated by a first dielectric fill material of the first pad-level dielectric layer 470; and a second semiconductor die 700 comprising a second substrate 708, second semiconductor devices 720, and second bonding pads 388 that are electrically connected to a respective node of the second semiconductor devices 720 and laterally surrounded by a second pad-level dielectric layer 370, wherein each of the second bonding pads 388 is bonded to a respective one of the first bonding pads 488.

In one embodiment, the at least one first encapsulated airgap 479 comprises a first continuous encapsulated airgap having a configuration of a two-dimensional intersecting grid of first airgap segments that laterally extend along a first horizontal direction hd1 and second airgap segments that laterally extend along a second horizontal direction hd2 as illustrated in FIG. 8B.

In one embodiment, the at least one first encapsulated airgap (479 or 469) comprises a two-dimensional array of discrete first encapsulated airgaps (479 or 469) having a first periodicity along a first horizontal direction hd1 and having a second periodicity along a second horizontal direction hd2 (as illustrated in FIG. 8B or as in the second exemplary structure).

In one embodiment, a segment of the at least one first encapsulated airgap 479 has a vertical cross-sectional profile in which a lateral dimension increases with a vertical distance from a horizontal plane including bonding interfaces between the first bonding pads 488 and the second bonding pads 388.

In one embodiment, each of the at least one first encapsulated airgap 469 has a vertical cross-sectional profile in which a vertical dimension increases with a lateral distance from a most proximal one among the first bonding pads 488.

In one embodiment, the at least one first encapsulated airgap 469 comprises a plurality of first encapsulated airgaps 469. A first subset of the plurality of first encapsulated airgaps 469 is located at a first distance from a horizontal plane including bonding interfaces between the first bonding pads 488 and the second bonding pads 388. A second subset of the plurality of first encapsulated airgaps 469 is located at a second distance from the horizontal plane including the bonding interfaces. The second distance may be less than the first distance by more than a vertical extent of the first subset of the plurality of first encapsulated airgaps 439.

In one embodiment, the first dielectric fill material of the first pad-level dielectric layer 470 is bonded to a second dielectric fill material within the second semiconductor die 700 as illustrated in FIGS. 11-15, 28, and 30.

In one embodiment, the second semiconductor die 700 comprises a second pad-level dielectric layer 370 including a continuously-extending portion of the second dielectric fill material (such as a second dielectric fill material layer 374. The second pad-level dielectric layer 370 comprises at least one second encapsulated airgap 379 located between neighboring pairs of second bonding pads 388 and encapsulated by the continuously-extending portion of the second dielectric fill material.

In one embodiment, each of the first bonding pads 488 comprises a first metal plate 484 and a first metallic capping layer (485 or 486) contacting a distal planar surface of the first metal plate 484. The distal planar surface is more distal from the first substrate 908 than the sidewall surfaces of the first metal plate 484 are from the first substrate 908. In one embodiment, each of the first metallic capping layers (485 or 485) comprises a horizontal surface that directly contacts and provides metal-to-metal bonding with a horizontal surface of a respective one of the second bonding pads 388.

In one embodiment, each of the first bonding pads 488 comprises a first metal plate 484 and a first metallic adhesion liner (483 or 482) contacting a proximal planar surface of the first metal plate 484. The proximal planar surface is more proximal to the first substrate 908 than the sidewall surfaces of the first metal plate 484 are to the first substrate 908.

In one embodiment, the first pad-level dielectric layer 470 comprises a first dielectric liner 472 comprising vertically-extending portions that laterally surround, and contact, a respective one of the first bonding pads 488 and a horizontally-extending portion adjoined to proximal ends of the vertically-extending portions, and the first dielectric fill material and the at least one first encapsulated airgap 479 are spaced from the first bonding pads 488 and from the first semiconductor devices 920 by the first dielectric liner 472.

In one embodiment, the first pad-level dielectric layer 470 comprises a first dielectric capping layer 468 overlying, and contacting, the first dielectric fill material and a dielectric surface of the second semiconductor die 700.

The airgaps 469 located between the bonding pads 488 of the second embodiment reduce the capacitance between adjacent bonding pads 488. This in turn reduces the signal RC delay for the bonded pairs of bonding pads (488, 388) in a bonded assembly of a first semiconductor die 900 and a second semiconductor die 700.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first semiconductor die comprising a first substrate, first semiconductor devices, and first bonding pads that are electrically connected to a respective node of the first semiconductor devices and laterally surrounded by a first pad-level dielectric layer, wherein the first pad-level dielectric layer comprises at least one first encapsulated airgap located between neighboring pairs of first bonding pads and encapsulated by a first dielectric fill material of the first pad-level dielectric layer; and
a second semiconductor die comprising a second substrate, second semiconductor devices, and second bonding pads that are electrically connected to a respective node of the second semiconductor devices and laterally surrounded by a second pad-level dielectric layer, wherein each of the second bonding pads is bonded to a respective one of the first bonding pads such that bonding interfaces between the first bonding pads and the second bonding pads are located within a horizontal plane,
wherein the first bonding pads are not in direct contact with the at least one first encapsulated airgap.

2. The bonded assembly of claim 1, wherein the at least one first encapsulated airgap comprises a first continuous encapsulated airgap having a configuration of a two-dimensional intersecting grid of first airgap segments that laterally extend along a first horizontal direction and second airgap segments that laterally extend along a second horizontal direction.

3. The bonded assembly of claim 1, wherein the at least one first encapsulated airgap comprises a two-dimensional array of discrete first encapsulated airgaps having a first periodicity along a first horizontal direction and having a second periodicity along a second horizontal direction.

4. The bonded assembly of claim 1, wherein a segment of the at least one first encapsulated airgap has a vertical cross-sectional profile in which a lateral dimension increases with a vertical distance from the horizontal plane including the bonding interfaces between the first bonding pads and the second bonding pads.

5. The bonded assembly of claim 1, wherein each of the at least one first encapsulated airgap has a vertical cross-sectional profile in which a vertical dimension increases with a lateral distance from a most proximal one of the first bonding pads.

6. The bonded assembly of claim 1, wherein:
the at least one first encapsulated airgap comprises a plurality of first encapsulated airgaps;
a first subset of the plurality of first encapsulated airgaps is located at a first distance from the horizontal plane including the bonding interfaces between the first bonding pads and the second bonding pads; and
a second subset of the plurality of first encapsulated airgaps is located at a second distance from the horizontal plane including the bonding interfaces, the second distance being less than the first distance by more than a vertical extent of the first subset of the plurality of first encapsulated airgaps.

7. The bonded assembly of claim 1, wherein the first dielectric fill material of the first pad-level dielectric layer is bonded to a second dielectric fill material within the second semiconductor die.

8. The bonded assembly of claim 7, wherein:
the second semiconductor die comprises a second pad-level dielectric layer including a continuously-extending portion of the second dielectric fill material; and
the second pad-level dielectric layer comprises at least one second encapsulated airgap located between neighboring pairs of second bonding pads and encapsulated by the continuously-extending portion of the second dielectric fill material.

9. The bonded assembly of claim 1, wherein:
each of the first bonding pads comprises a first metal plate and a first metallic capping layer contacting a distal planar surface of the first metal plate, the distal planar surface being more distal from the first substrate than the sidewall surfaces of the first metal plate are from the first substrate; and
each of the first metallic capping layers comprises a horizontal surface that directly contacts and provides metal-to-metal bonding with a horizontal surface of a respective one of the second bonding pads.

10. The bonded assembly of claim 1, wherein each of the first bonding pads comprises a first metal plate and a first metallic adhesion liner contacting a proximal planar surface of the first metal plate, the proximal planar surface being more proximal to the first substrate than the sidewall surfaces of the first metal plate are to the first substrate.

11. The bonded assembly of claim 1, wherein:
the first pad-level dielectric layer further comprises a first dielectric liner comprising vertically-extending portions that laterally surround, and contact, a respective one of the first bonding pads and a horizontally-extending portion adjoined to proximal ends of the vertically-extending portions; and
the first dielectric fill material and the at least one first encapsulated airgap are spaced from the first bonding pads and from the first semiconductor devices by the first dielectric liner.

12. The bonded assembly of claim 1, wherein the first pad-level dielectric layer comprises a first dielectric capping layer overlying and contacting the first dielectric fill material and a dielectric surface of the second semiconductor die.

13. The bonded assembly of claim 8, wherein the second pad-level dielectric layer is in direct contact with the first pad-level dielectric layer.

14. The bonded assembly of claim 13, wherein the at least one second encapsulated airgap is located entirely on a second side of the horizontal plane.

15. The bonded assembly of claim 8, wherein each of the second bonding pads is laterally spaced from the at least one second encapsulated airgap by a respective vertically-extending portion of the second dielectric fill material.

16. The bonded assembly of claim 1, wherein the second bonding pads are not in direct contact with the at least one first encapsulated airgap.

17. The bonded assembly of claim 1, wherein each of the first bonding pads is laterally spaced from the at least one first encapsulated airgap by at least a respective vertically-extending portion of the first dielectric fill material of the first pad-level dielectric layer.

18. The bonded assembly of claim 1, wherein the first semiconductor die comprises a first dielectric liner in direct contact with sidewalls of the first bonding pads and in direct contact with the vertically-extending portions of the first dielectric fill material of the first pad-level dielectric layer.

19. The bonded assembly of claim 1, wherein:
one of the first bonding pads is bonded to one of the second bonding pads at one of the bonding interfaces; and
an upper portion of said one of the first bonding pads vertically extends through an opening in the first pad-level dielectric layer has a lesser lateral extent than a lower portion of said one of the first bonding pads that is vertically spaced from the horizontal plane by the opening in the first pad-level dielectric layer.

20. The bonded assembly of claim 1, wherein the at least one first encapsulated airgap comprises a plurality of encapsulated airgaps that comprise:
at least one first-type encapsulated airgap that is vertically spaced from the horizontal plane by a first vertical distance; and
at least one second-type encapsulated airgap that is vertically spaced from the horizontal plane by a second vertical distance that is different from the first vertical distance.

* * * * *